United States Patent
Hersam et al.

(10) Patent No.: US 10,906,811 B2
(45) Date of Patent: Feb. 2, 2021

(54) COMPOSITION COMPRISING OPTICALLY AND ELECTRONICALLY ACTIVE PHOSPHORENE

(71) Applicant: NORTHWESTERN UNIVERSITY, Evanston, IL (US)

(72) Inventors: Mark C. Hersam, Wilmette, IL (US); Joohoon Kang, Evanston, IL (US); Joshua D. Wood, Chicago, IL (US)

(73) Assignee: NORTHWESTERN UNIVERSITY, Evanston, IL (US)

( * ) Notice: Subject to any disclaimer, the term of this patent is extended or adjusted under 35 U.S.C. 154(b) by 0 days.

(21) Appl. No.: 16/411,345

(22) Filed: May 14, 2019

(65) Prior Publication Data

US 2020/0354219 A1  Nov. 12, 2020

Related U.S. Application Data

(62) Division of application No. 15/446,832, filed on Mar. 1, 2017, now Pat. No. 10,343,909.

(60) Provisional application No. 62/389,537, filed on Mar. 1, 2016.

(51) Int. Cl.
| | | |
|---|---|---|
| *H01B 1/06* | (2006.01) | |
| *C01B 25/00* | (2006.01) | |
| *B82Y 30/00* | (2011.01) | |
| *C01B 25/02* | (2006.01) | |
| *H01L 29/06* | (2006.01) | |
| *B82Y 10/00* | (2011.01) | |
| *B82Y 40/00* | (2011.01) | |
| *H01L 29/786* | (2006.01) | |
| *H01L 29/24* | (2006.01) | |
| *H01L 29/775* | (2006.01) | |

(52) U.S. Cl.
CPC .............. *C01B 25/02* (2013.01); *B82Y 10/00* (2013.01); *B82Y 30/00* (2013.01); *B82Y 40/00* (2013.01); *C01B 25/003* (2013.01); *H01B 1/06* (2013.01); *H01L 29/0665* (2013.01); *C01P 2004/24* (2013.01); *C01P 2006/40* (2013.01); *H01L 29/24* (2013.01); *H01L 29/775* (2013.01); *H01L 29/78681* (2013.01); *H01L 29/78696* (2013.01)

(58) Field of Classification Search
CPC ....... C01B 25/00; C01B 25/003; C01B 25/46; H01B 1/06; B82Y 30/00
See application file for complete search history.

(56) References Cited

U.S. PATENT DOCUMENTS

| | | | | |
|---|---|---|---|---|
| 9,461,125 | B2 * | 10/2016 | Lee | C01B 25/02 |
| 2017/0044683 | A1 * | 2/2017 | Cullen | C01B 25/003 |
| 2017/0291819 | A1 * | 10/2017 | Cho | C01B 32/23 |

OTHER PUBLICATIONS

Hanlon et al "Liquid exfoliation of solvent-stabilized few-layer black phosphorus . . . ", Nature Communications, 2015, DOI: 10.1038/ncomms9563 (pp. 1-11.*

(Continued)

*Primary Examiner* — Mark Kopec
(74) *Attorney, Agent, or Firm* — Locke Lord LLP; Tim Tingkang Xia Esq.

(57) ABSTRACT

A composition includes a few-layer phosphorene nanomaterial comprising at least one of mono-, bi-, and n-layer phosphorene nanosheets, where n is an integer selected from 3 to 6; deoxygenated water; and at least one amphiphilic surface active component.

16 Claims, 28 Drawing Sheets

(56) References Cited

OTHER PUBLICATIONS

Lu et al "Plasma-assisted fabrication of monolayer phosphorene and its Raman characterization", Nano Research 2014, 7(6): 853-859.*
Kim et al "Toward air-stable multilayer phosphorene thin-films and transistors", Scientific Reports 5:8989, DOI: 1038/srep08989.*
Butler et al "Removal of dissolved oxygen from water: A comparison of four common techniques", Talanta, vol. 41, No. 2, pp. 211-215.*

* cited by examiner

Figure 2A
Figure 2B
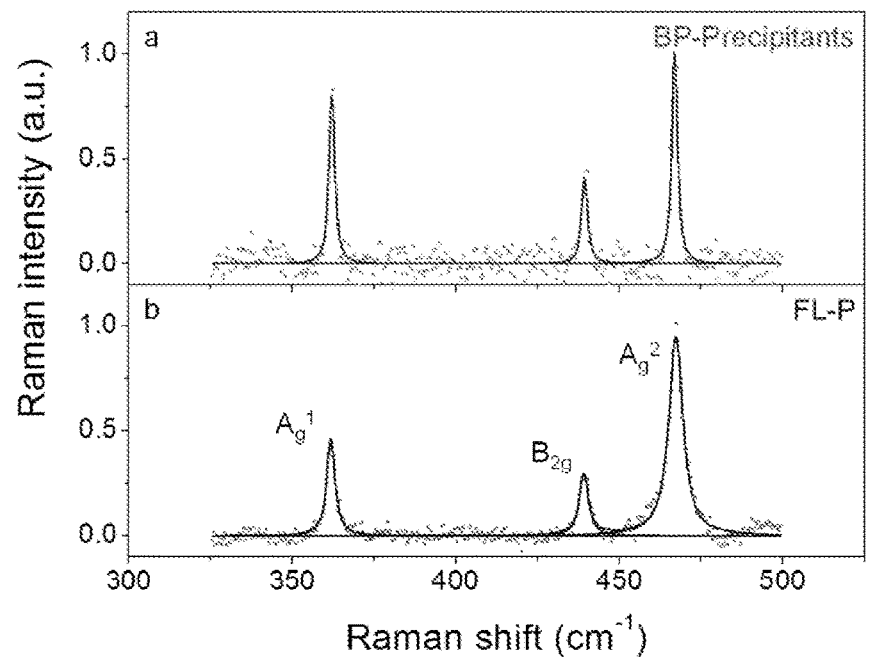
Figure 3A
Figure 3B
Figure 3C
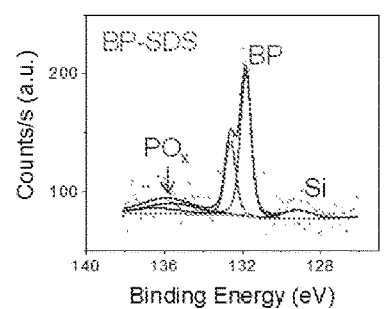
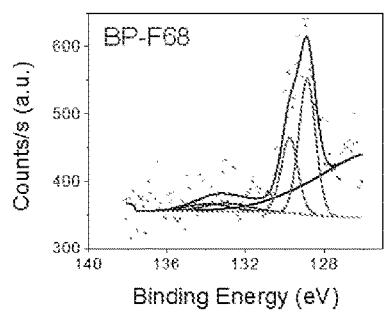
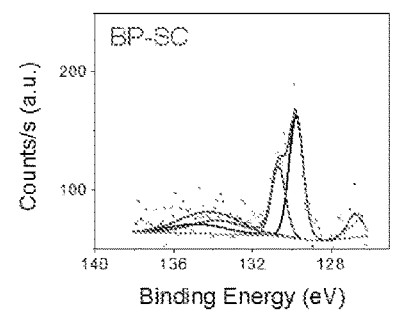

Figure 8D
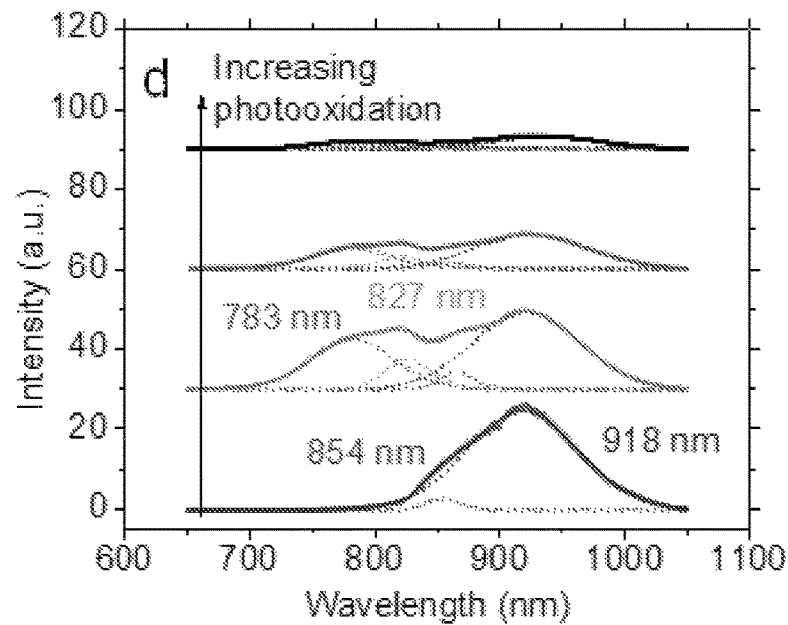
Figure 9A
Figure 9B
Figure 9C
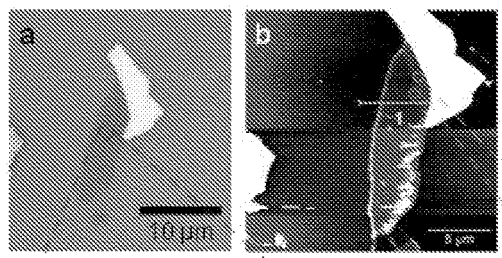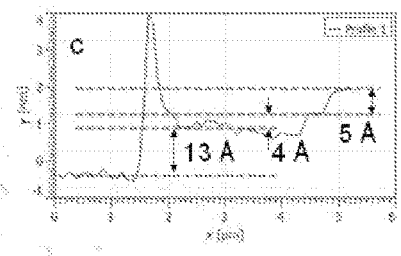
Figure 9D
Figure 9E
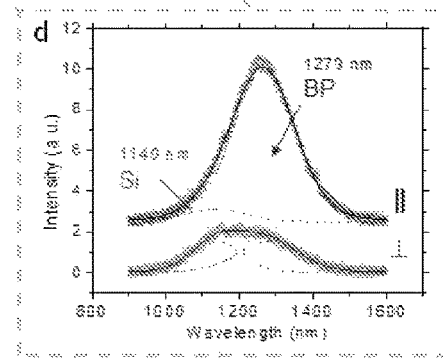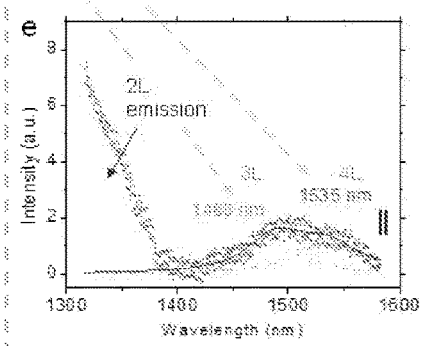

Figure 11A 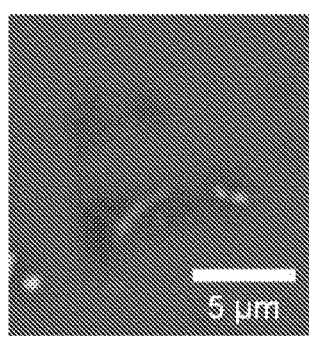 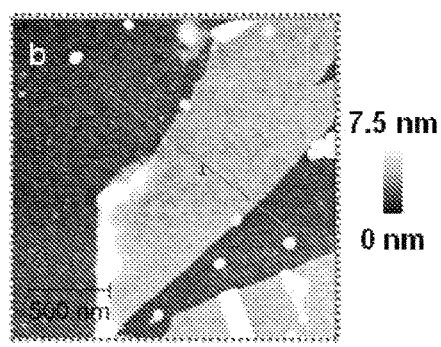 Figure 11B
Figure 11C
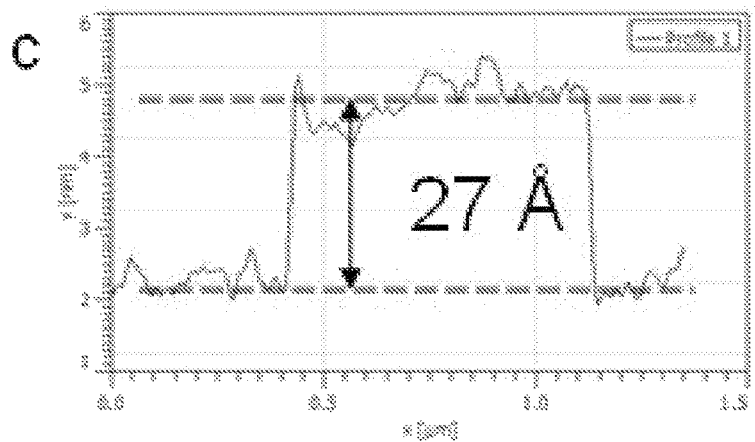

Figure 14F
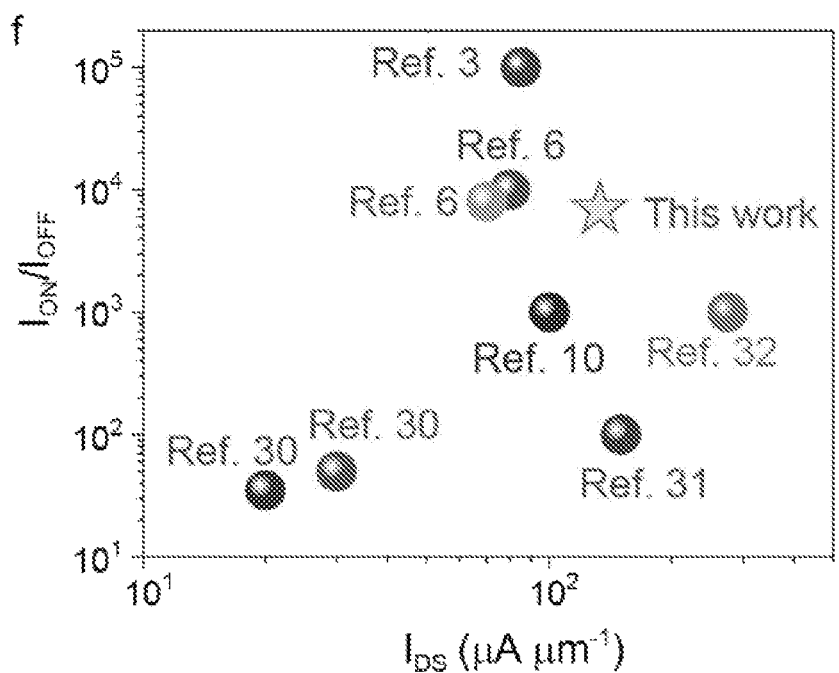
| Figure 15A | Figure 15B | Figure 15C |
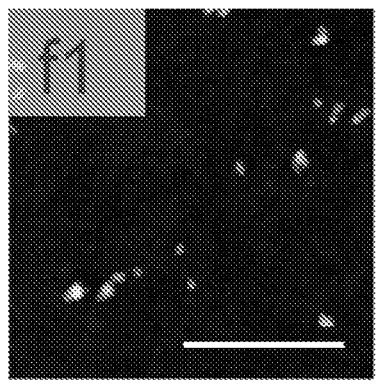
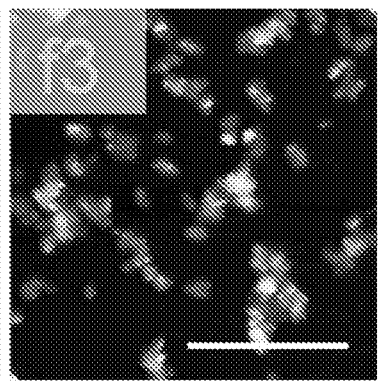
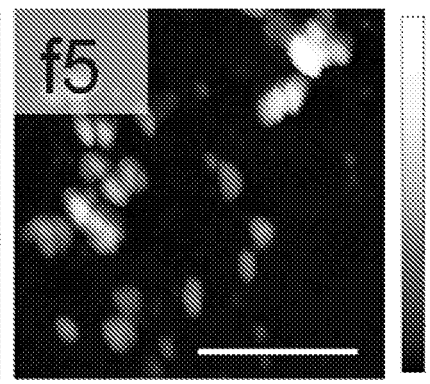

COMPOSITION COMPRISING OPTICALLY AND ELECTRONICALLY ACTIVE PHOSPHORENE

CROSS-REFERENCE TO RELATED PATENT APPLICATIONS

This application is a divisional application of U.S. patent application Ser. No. 15/446,832, filed Mar. 1, 2017, now U.S. Pat. No. 10,343,909, which itself claims priority to and the benefit of U.S. Provisional Patent Application Ser. No. 62/389,537 filed Mar. 1, 2016, which are incorporated herein by reference in their entireties.

STATEMENT AS TO RIGHTS UNDER FEDERALLY-SPONSORED RESEARCH

This invention was made with government support under DMR-1505849 and DMR-1121262 awarded by the National Science Foundation, and N00014-14-1-0669 awarded by the Office of Naval Research. The government has certain rights in the invention.

FIELD OF THE INVENTION

This invention relates generally to the field of materials, and more particularly, to an oxidatively-stable few-layer phosphorene composition.

BACKGROUND OF THE INVENTION

Few-layer phosphorene (FL-P) isolated by micromechanical exfoliation has been widely studied, both fundamentally and in applications such as high-performance electronic and optoelectronic devices. Although micromechanical exfoliation provides individual, high-quality FL-P flakes, this technique is not scalable and is not amenable to large-area applications. Conventional approaches for mass production of two-dimensional (2D) nanomaterials involve chemical vapor deposition (CVD) and liquid phase exfoliation (LPE). Whereas CVD growth of black phosphorus (BP) thin films is hindered by challenges with molecular precursors and extreme growth conditions, LPE of BP has been demonstrated and used for the large-scale deposition of thin films, following approaches for other 2D nanomaterials. Specifically, stable BP dispersions have been produced by LPE using high boiling point solvents such as N-methyl-2-pyrrolidone (NMP), dimethylformamide (DMF), dimethyl sulfoxide (DMSO), and N-cyclohexyl-2-pyrrolidone (CHP). With these anhydrous organic solvents, chemical degradation from ambient $O_2$ and water are avoided, but the exfoliation yield and flake size distribution are suboptimal. Furthermore, organic solvents have limited compatibility with methods such as ultracentrifugation, preventing structural fine tuning and sorting. Such solvents also have high boiling points and safety issues, presenting post-processing challenges.

SUMMARY OF THE INVENTION

In light of the foregoing, it is an object of the present invention to provide stable aqueous dispersions of phosphorene and/or methods for their preparation, thereby overcoming various deficiencies and shortcomings of the prior art, including those outlined above. It will be understood by those skilled in the art that one or more aspects of this invention can meet certain objectives, while one or more other aspects can meet certain other objectives. Each objective may not apply equally, in all its respects, to every aspect of this invention. As such, the following objects can be viewed in the alternative with respect to any one aspect of this invention.

It can be an object of the present invention to provide a method for production of two-dimensional phosphorene nanomaterials, such methods as can be scalable and adaptable to large-area applications, without use of organic solvents.

It can be another aspect of the present invention to provide one or more such methods without chemical degradation from ambient oxygen.

It can be another object of the present invention to provide one or more such methods compatible with ultracentrifugation together with structural fine tuning and sorting via thickness and/or area dimension.

It can be another object of the present invention, alone or in conjunction with one or more of the preceding objectives, to provide for isolation and production of few-layer phosphorene in quantities required for downstream processing and applications, including but not limited to the fabrication of the electronic and optoelectronic devices.

Other objects, features, benefits and advantages of the present invention will be apparent from the summary of the invention together with descriptions of certain embodiments thereof, and will be readily apparent to those skilled in the art having knowledge of phosphorene isolation and exfoliation techniques. Such objects, features, benefits and advantages will be apparent from the above as taken into conjunction with the accompanying examples, data, figures and all reasonable inferences to be drawn therefrom.

In part, the present invention can be directed to a method of preparing few-layer phosphorene. Such a method can comprise providing a composition comprising a black phosphorus starting material; one or more amphiphilic surface active components and deoxygenated water; sonicating such a composition to provide a deoxygenated aqueous medium comprising exfoliated phosphorous nanomaterials; and centrifuging such an aqueous medium to provide a supernatant component comprising a polydisperse population of planar few-layer phosphorene nanomaterials comprising mono-, bi-, and n-layer few-layer phosphorene nanosheets, wherein n can be an integer selected from 3- about 6.

In certain embodiments, such a surface active component can be selected from alkali metal alkylsulfates and combinations thereof. Without limitation, such a surface active component can be sodium dodecylsulfate. In certain other embodiments, such a surface active component can be selected from bile salts and combinations thereof. Without limitation, such a surface active component can be sodium cholate. In yet other embodiments, such a surface active component can be selected from non-ionic triblock oxalkylene copolymers and combinations thereof. Without limitation, such a surface active component can be a copolymer of oxyethylene and oxypropylene.

Regardless, such a method can also comprise separating the few-layer phosphorene nanomaterials into two or more separation fractions comprising a subpopulation of few-layer phosphorene nanosheets comprising a surface area, each such fraction as can compromise monolayer phosphorene nanosheets, bilayer phosphorene nanosheets and trilayer phosphorene nanosheets, or combinations thereof. In certain non-limiting embodiments, separation can be achieved by centrifuging such few-layer phosphorene nanomaterials in a fluid medium comprising a density gradient for at least one of a time and at a rotational rate sufficient to provide two or more separation fractions.

Without limitation, such a fluid medium can comprise aqueous iodixanol. As a separate consideration, such a fluid medium can comprise a plurality of aqueous iodixanol concentrations, such a density gradient as can comprise a range of concentration densities. In certain such embodiments, such a few-layer phosphorene fraction can be within such a density gradient at a substantially invariant point during centrifugation, and such an invariant point as can comprise a density approximating the buoyant density of such a few-layer phosphorene fraction.

Such a method can further comprise isolating at least one such separation fraction from such a fluid medium. In certain embodiments, at least one of two or more such fractions can be deposited on a substrate. Without limitation, such a substrate and deposited few-layer phosphorene can be incorporated into an electronic or an optoelectronic device.

In part, the present invention can also be directed to an alternate method of preparing few-layer phosphorene. Such a method can comprise providing a composition comprising a black phosphorus starting material, one or more amphiphilic surface active components and deoxygenated water; sonicating such a composition to provide a deoxygenated aqueous medium comprising exfoliated phosphorous nanomaterials;

centrifuging such an aqueous medium to provide a supernatant component comprising a polydisperse population of planar few-layer phosphorene nanomaterials comprising mono-, bi-, and n-layer few-layer phosphorene nanosheets, wherein n can be an integer selected from 3- about 6; and separating the few-layer phosphorene nanomaterials into two or more separation fractions comprising a subpopulation of few-layer phosphorene nanosheets comprising monolayer phosphorene nanosheets, bilayer phosphorene nanosheets and trilayer phosphorene nanosheets, or combinations thereof. In certain non-limiting embodiments, separation can be achieved by centrifuging such few-layer phosphorene nanomaterials in a fluid medium comprising a density gradient for at least one of a time and at a rotational rate sufficient to provide two or more separation fractions. Surface active components and fluid media density gradients can be discussed above or elsewhere herein.

In part, the present invention can also be directed to a method of using a deoxygenated aqueous medium to exfoliate black phosphorus and prepare stable few-layer phosphorene nanomaterials. Such a method can comprise providing a composition comprising a black phosphorus starting material; one or more amphiphilic surface active components and deoxygenated water; sonicating such a composition to provide a deoxygenated aqueous medium comprising exfoliated phosphorous nanomaterials; and centrifuging such an aqueous medium to provide a supernatant component comprising a polydisperse population of planar few-layer phosphorene nanomaterials comprising mono-, bi-, and n-layer few-layer phosphorene nanosheets, wherein n can be an integer selected from 3- about 6. Such few-layer phosphorene nanosheets can be substantially unoxidized and characterized, by degree of oxidative stability, by spectroscopic methods of the sort described herein.

Such a method can also comprise separating the few-layer phosphorene nanomaterials into two or more separation fractions comprising a subpopulation of few-layer phosphorene nanosheets comprising monolayer phosphorene nanosheets, bilayer phosphorene nanosheets and trilayer phosphorene nanosheets, or combinations thereof. In certain non-limiting embodiments, separation can be achieved by centrifuging such a few-layer phosphorene nanomaterials in a fluid medium comprising a density gradient for at least one of a time and at a rotational rate sufficient to provide two or more separation fractions. Again, surface active components and fluid media density gradients can be as discussed above or elsewhere herein.

Accordingly, the present invention can also be directed to an oxidatively-stable few-layer phosphorene composition. Such a composition can comprise a few-layer phosphorene nanomaterial comprising mono-, bi- and/or n-layer phosphorene nanosheets, where n can be an integer selected from 3- about 6; deoxygenated water and one or more amphiphilic surface active components of the sort discussed above or illustrated elsewhere herein.

BRIEF DESCRIPTION OF THE DRAWINGS

FIGS. 2A-B. Raman spectra of BP precipitants and few-layer phosphorene (FL-P). A, The liquid-phase Raman spectrum from BP precipitants shows three modes at ~362 cm$^{-1}$, ~439 cm$^{-1}$, and ~467 cm$^{-1}$ with full width half maximum (FWHM) values of ~1.96 cm$^{-1}$, ~2.12 cm$^{-1}$, and ~1.95 cm$^{-1}$, respectively. B, Conversely, the spectrum from FL-P shows three modes at ~362 cm$^{-1}$, ~439 cm$^{-1}$, and ~466 cm$^{-1}$ with FWHM values of ~2.96 cm$^{-1}$, ~3.31 cm$^{-1}$, and ~5.13 cm$^{-1}$, respectively.

FIGS. 3A-C. XPS data for FL-P prepared with different surfactants. P 2p core level spectra for sodium dodecylsulfate (violet, 3A), Pluronic F68 (blue, 3B), and sodium cholate (green, 3C).

FIGS. 8A-D. Digital images and photoluminescence (PL) spectra of exfoliated, monolayer phosphorene. A, Optical image of a monolayer phosphorene flake (blue outline), passivated from ambient oxidation with ~2.6 nm of ~50° C. $AlO_x$.2 B, PL spectra of the phosphorene flake in (a), excited with a linearly polarized, 532 nm laser at ~15 µW (100×, 0.9 NA objective, 10 s acquisition in air). The phosphorene monolayer emits at 924 nm (~1.34 eV), near the expected wavelength, whereas emissions from the $SiO_2$ substrate (purple) are absent. Additional emissions in the visible are present (761 nm, 823 nm, and 867 nm, respectively), potentially related to oxidized BP regions. C, Optical image of a second phosphorene region (blue outline), passivated like (a). D, PL spectra of the flake in (c) after successive spectral acquisitions with a 532 nm laser at ~15 µW (100×, 0.9 NA objective, 20 s acquisition in air). While the phosphorene monolayer has its excitonic emission at ~918 nm (~1.35 eV), it possesses a small oxide peak at ~854 nm (~1.45 eV). With additional measurements, the monolayer phosphorene emission decreases in intensity with the concurrent emergence of oxide-related bands (ca. 783 nm and 827 nm, respectively), indicative of photooxidation.

FIGS. 9A-E. Digital images and PL spectra of bilayer phosphorene with three-layer and four-layer regions. A, Optical image of a bilayer phosphorene flake (dark blue) attached to a thick BP region, passivated by ~10.0 nm $AlO_x$ (~2.5 nm at 50° C. ALD, ~7.5 nm at 150° C. ALD). B, AFM height image of the flake in (a), showing bilayer, three-layer, and four-layer phosphorene areas. C, Height profile along the contour in (b). Bilayer (~1.3 nm), three-layer (~1.7 nm), four-layer (~2.2 nm) steps indicated (−0.5 nm from instrumental factors, $AlO_x$ overlayer homogeneity, and adhesion). D, PL spectra of the bilayer phosphorene (blue spot, a), excited with a 532 nm laser at ~150 µW (50×, 0.8 NA objective, 5 s acquisition in air). The laser polarization was adjusted to maximize the bilayer emission relative to the 1143 nm (~1.08 eV) Si emission (termed "parallel" orientation: ☐). Under parallel orientation, the bilayer phosphorene emits at 1279 nm (~0.97 eV). To confirm the anisotropic optical properties of BP, the bilayer emission was dampened five-fold by rotating the laser polarization 90° (±20°) relative to the parallel orientation (termed "perpendicular" orientation: ⊥). E, PL spectrum from three-layer (green spot) and four-layer (magenta spot) phosphorene steps of (b), excited like (d). Spectrum taken from a single area on the bilayer phosphorene. While the bilayer phosphorene emission persists, emissions occur at 1488 nm (~0.83 eV) and 1535 nm (~0.81 eV) for three-layer and four-layer phosphorene, respectively.

FIGS. 11A-D. PL spectra of passivated, five-layer phosphorene. A, Optical image of a five-layer phosphorene flake, passivated by ~12.6 nm $AlO_x$ (~2.6 nm at 50° C. ALD, ~10 nm at 150° C. ALD). B, AFM height image of the boxed region in (a). C, Height profile along the line in (b). Passivated phosphorene flake is ~2.7 nm tall, indicative of five-layer phosphorene (~0.5 nm additional, as aforementioned). D, PL spectrum of the phosphorene flake in (b), excited in the "parallel" orientation with a 532 nm laser at ~150 µW (50×, 0.8 NA objective, 5 s acquisition in air). Passivated, five-layer phosphorene emits (blue) at 1582 nm (~0.78 eV), and the Si substrate emits (red) at 1129 nm (~1.10 eV), as expected.

FIGS. 14A-F. Digital images and graphs illustrating size sorting and electrical properties of FL-P aqueous dispersions. A, Images of FL-P solution before (left) and after (right) size sorting using sedimentation-based density gradient ultracentrifugation (s-DGU). B, Histogram of flake areas for fractions f1 to f6. C, False-colored SEM image of an FL-P nanosheet FET with higher magnification image of the channel (inset). D, Output curves for a FL-P FET. E, Transfer curve for a FL-P FET plotted in linear scale (blue) and semi-log scale (green) for Vps values of −1 V (open circles) and −25 mV (closed circles). F, Plot of $I_{ON}/I_{OFF}$ versus drive current that compares this work to previously reported BP FETs.

FIGS. 15A-C. Digital images showing area of size-sorted FL-P nanosheets. AFM images of fractions 1, 3, and 5 (FIGS. 15A, 15B, and 15C, respectively) after sedimentation-based density gradient ultracentrifugation (Scale bars: 1 μm, Height: 10, 30, and 30 nm, respectively).

DETAILED DESCRIPTION OF THE INVENTION

Figure 1A:
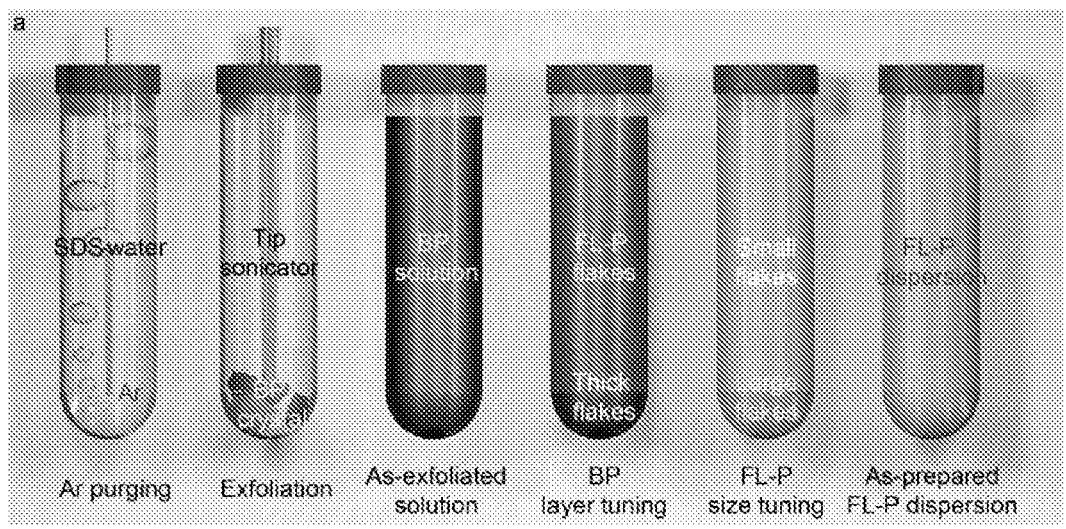
FIGS. 1A-H. Digital images and spectra illustrating experimental procedure and characterization of FL-P nanosheets. A, Schematic of the preparation method for FL-P aqueous dispersions. Deoxygenated water with 2% w v$^{-1}$ SDS was prepared by ultrahigh purity Ar purging. The BP crystal was exfoliated in a sealed container using tip ultrasonication, and then centrifuged to remove unexfoliated BP crystals. The FL-P dispersion was subsequently collected and ultracentrifuged to precipitate large flakes. The supernatant was finally redispersed in deoxygenated water. B, Images of the as-exfoliated BP solution (left) and FL-P solution (right). C, Low-magnification transmission electron microscopy (TEM) image of FL-P nanosheets. D, High-resolution TEM image of a FL-P nanosheet. E, Selected area electron diffraction (SAED) pattern of FL-P nanosheets. F, Solution phase Raman spectrum of FL-P nanosheets. G, Visible photoluminescence (PL) spectrum of FL-P nanosheets using an excitation wavelength of 532 nm with a Si CCD. H, X-ray photoelectron spectroscopy (XPS) analysis of the FL-P nanosheets.
Figure 1B:
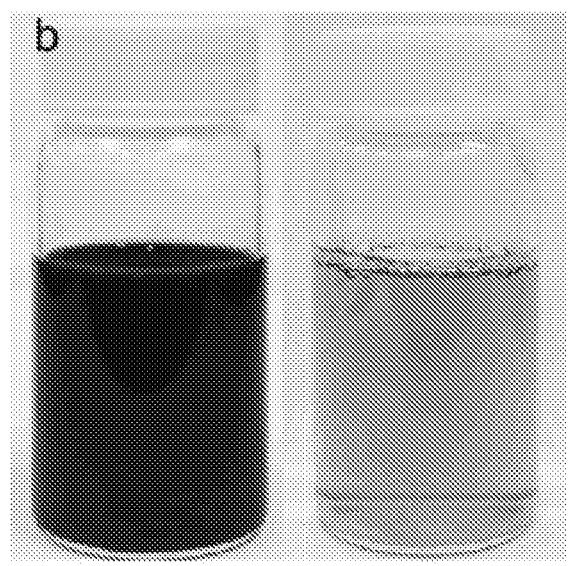

As relates to certain non-limiting embodiments, this invention provides a scalable, high-yield, and environmentally benign method for preparing FL-P via ultrasonication in deoxygenated water. FIG. 1A depicts a procedure for obtaining FL-P enriched dispersions and related compositions. To minimize BP chemical degradation, deoxygenated water is prepared by purging deionized water with ultrahigh purity Ar gas in a sealed container. Bulk BP crystals are then exfoliated with tip ultrasonication in a vessel sealed in an Ar environment that contains deoxygenated water with 2% w v$^{-1}$ sodium dodecylsulfate (SDS). For FL-P enrichment, as-prepared BP solutions undergo two steps of sedimentation-based ultracentrifugation to isolate thin flakes with relatively large lateral area. Initially, the as-exfoliated solution is dark brown (FIG. 1B, left), softening to light pale yellow after solution dilution and thick flake removal (FIG. 1B, right).

Figure 1C:
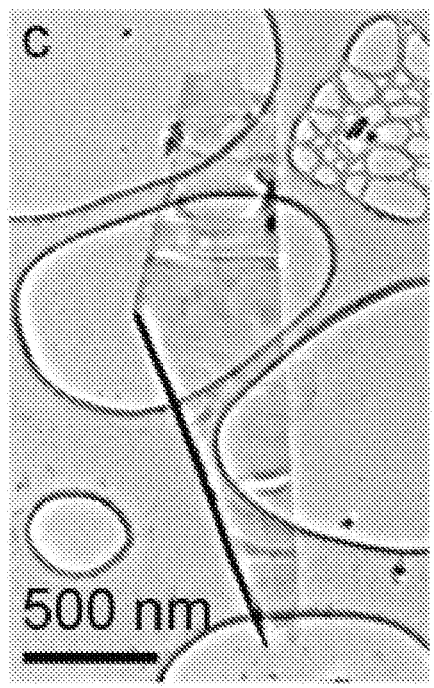
Figure 1D:
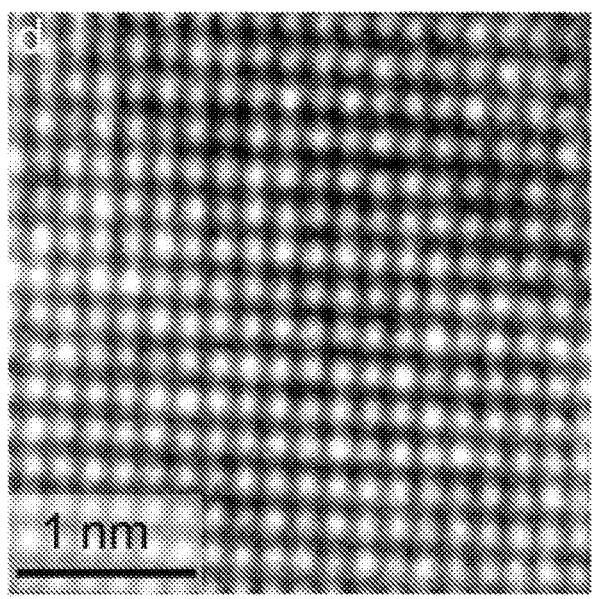
Figure 1E:
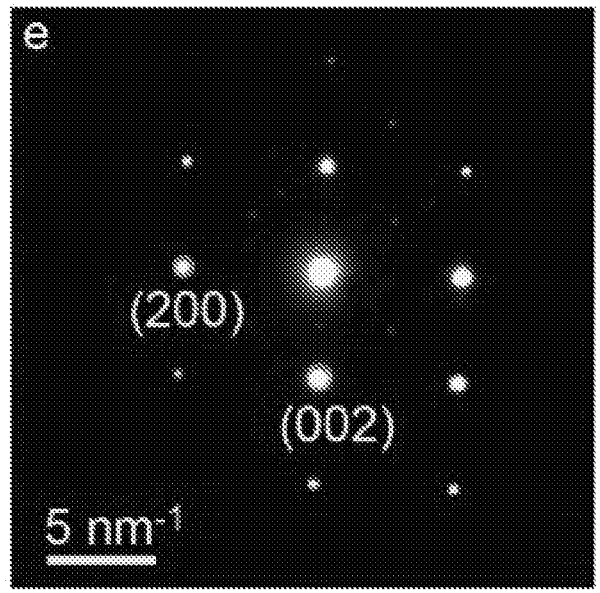
Figure 1F:
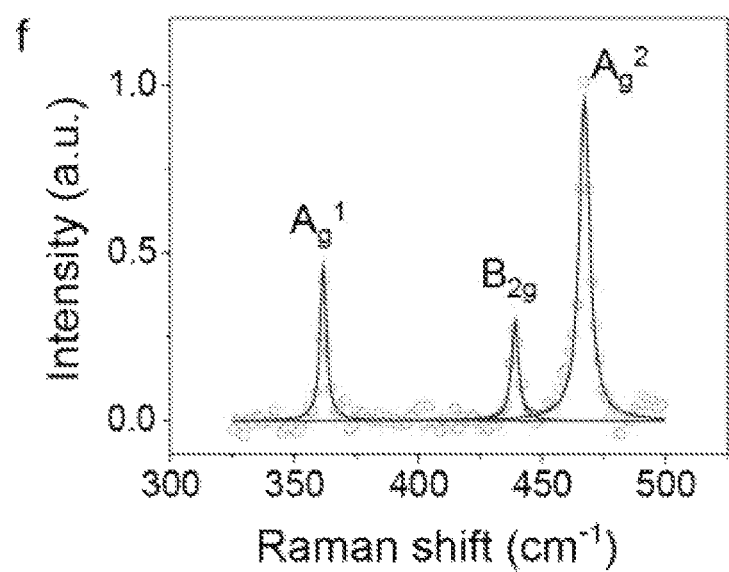
Figure 1G:
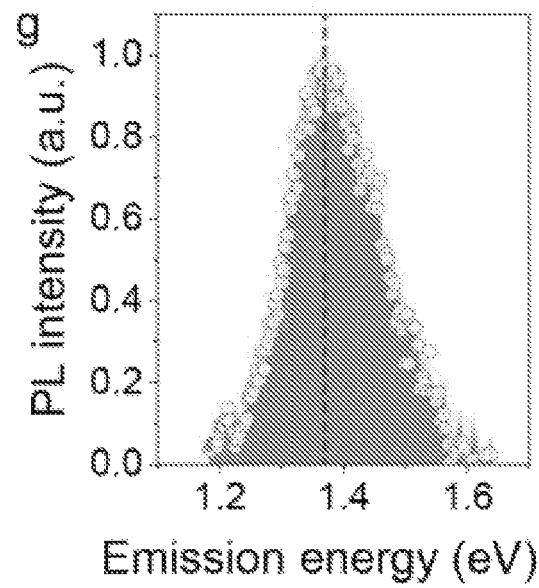
Figure 1H:
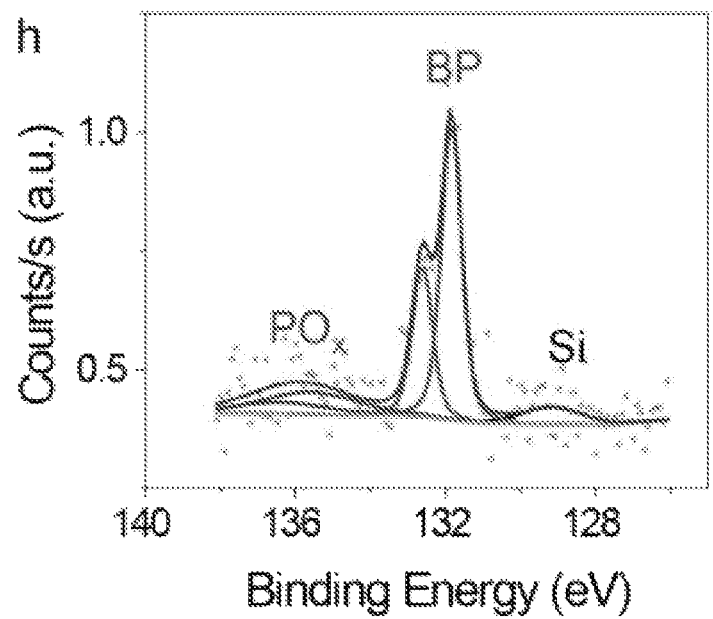

The chemical, structural, and optical properties of the resulting FL-P solutions are ascertained through transmission electron microscopy (TEM), Raman spectroscopy, photoluminescence (PL) spectroscopy, and X-ray photoelectron spectroscopy (XPS). FIG. 1C shows a representative, low-magnification TEM image of a FL-P nanosheet, while the high-resolution TEM (HRTEM) image of FIG. 1D reveals the atomic structure. Selected area electron diffraction (SAED) patterns (FIG. 1E) confirm that the FL-P nanosheets are crystalline and orthorhombic in structure. The HRTEM and SAED data further show no evidence of structural disorder or oxidation. In FIG. 1F, a liquid-phase Raman spectrum from the FL-P dispersion shows the three representative BP Raman modes at ~362 cm$^{-1}$ ($A_g^1$), ~439 cm$^{-1}$ ($B_{2g}$), and ~466 cm$^{-1}$ ($A_g^2$), with corresponding full-width at half-maximum (FWHM) values of 3.0, 3.3, and 5.1 cm$^{-1}$, respectively. Monolayer and few-layer phosphorene flakes have higher FWHM values than thicker (>5 nm) BP, making the FWHM broadening compared to precipitated, thicker BP dispersions indicative of FL-P enrichment in this process (FIGS. 2A-B). A visible (Si CCD) PL spectrum of the FL-P dispersion taken with 532 nm excitation reveals an emission peak at ~1.37 eV, consistent with previous reports for monolayer phosphorene (FIG. 1G). Finally, the chemical quality of the FL-P flakes is assessed using XPS in FIG. 1H. XPS shows that FL-P exhibits the P $2p_{3/2}$ and P $2p_{1/2}$ doublet, characteristic of crystalline BP. Weak oxidized phosphorus (i.e., PDx) sub-bands are also observed at ~136 eV in agreement with previous measurements of electronic-grade BP. XPS taken on FL-P prepared with other conventional surfactants (e.g., SDS, Pluronic F68 and sodium cholate) display similar results (FIGS. 3A-C).

Figure 4A:
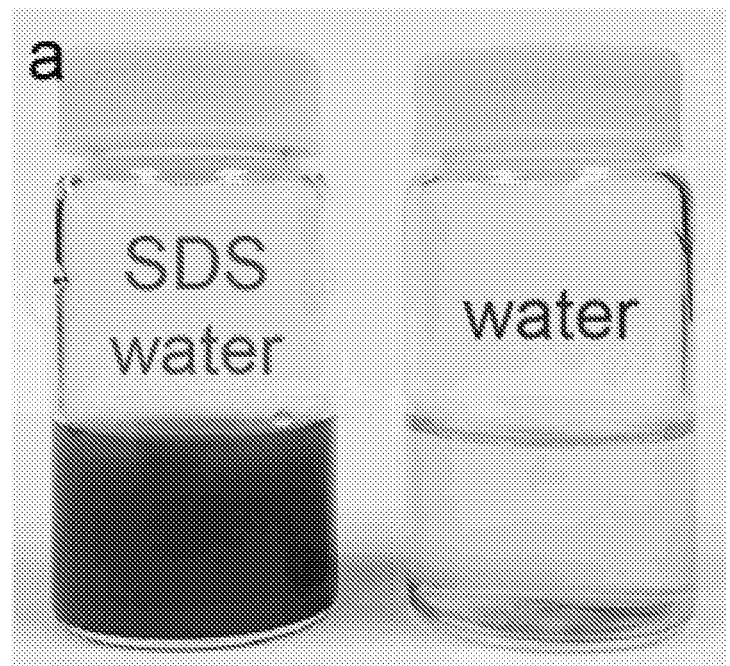
FIGS. 4A-J. Digital images and graphs illustrating surface properties and exfoliation yield of BP in aqueous solution. A, Image of a BP dispersion in deoxygenated water with and without SDS. B, Image of a water contact angle measurement on an as-exfoliated flat BP crystal surface. C, Optical absorbance spectra of BP dispersions with (red) and without (blue) SDS. D, Zeta potential measurement of BP in water (blue), SDS-water (orange), and BP in SDS-water (red). E,F, Images of BP dispersions in SDS-water and NMP after sonication and centrifugation at 0.5 k, 5 k, 10 k, and 15 k r.p.m. G, Concentration of the BP dispersions from part (e) and (f). H,I, AFM height images of BP nanosheets processed in SDS-water and NMP. J, Thickness distribution of BP nanosheets in SDS-water (red) and NMP (green).
Figure 4B:
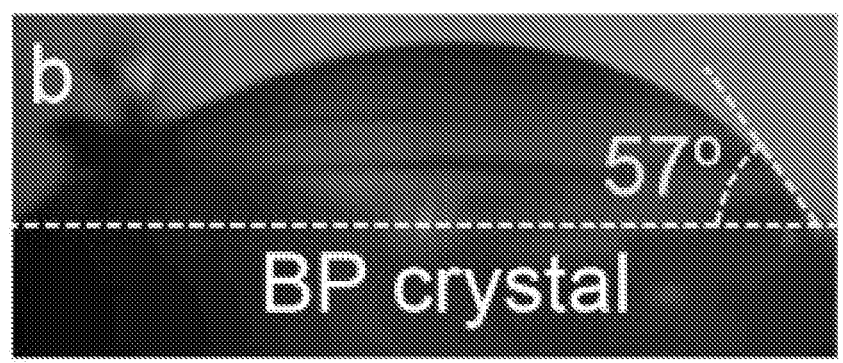
Figure 4C:
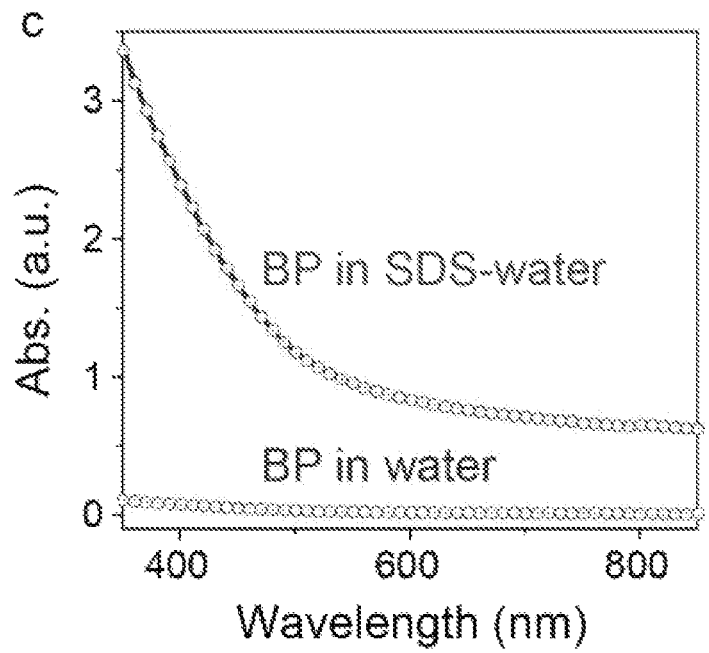
Figure 4D:
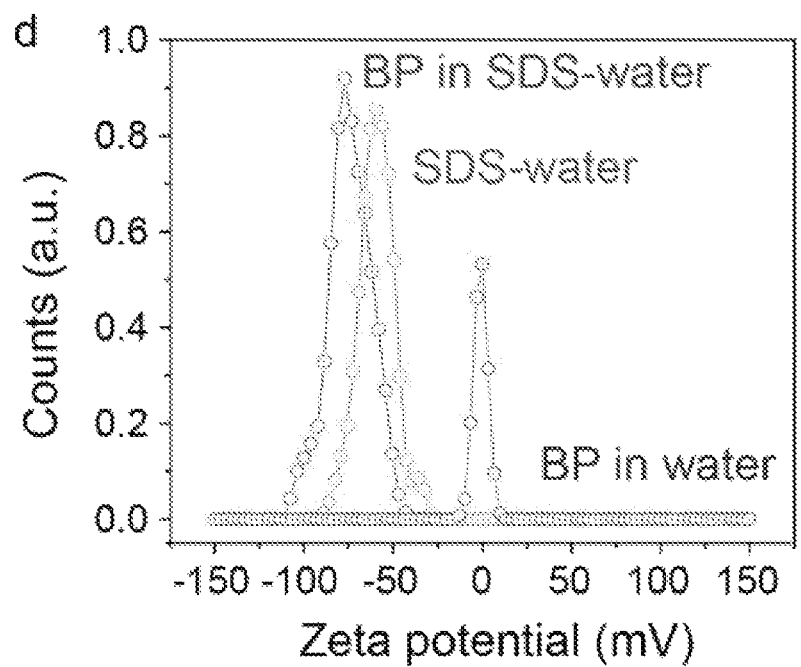

Although BP has been described as highly hydrophilic, the FL-P dispersion is only stabilized with the incorporation of amphiphilic surfactants in aqueous solution. While an aqueous BP dispersion prepared with SDS results in a stable dark brown solution (FIG. 4A, left), BP dispersed in water without surfactants precipitates quickly (FIG. 4A, right). To clarify this apparent contradiction, the hydrophilicity of the BP surface was measured with contact angle measurements on a freshly cleaved flat BP crystal. FIG. 4B shows that, immediately following exfoliation, the BP surface has an average contact angle of ~57°, indicating that the hydrophilicity of BP is between graphene oxide (~27°) and other 2D nanomaterials (~90°) such as graphene and transition metal dichalcogenides. From the higher optical absorbance (FIG. 4C) and lower zeta potential value (FIG. 4D), the relatively hydrophobic, freshly exfoliated BP nanosheets are stabilized in aqueous solution with amphiphilic surfactants.

Figure 4E:
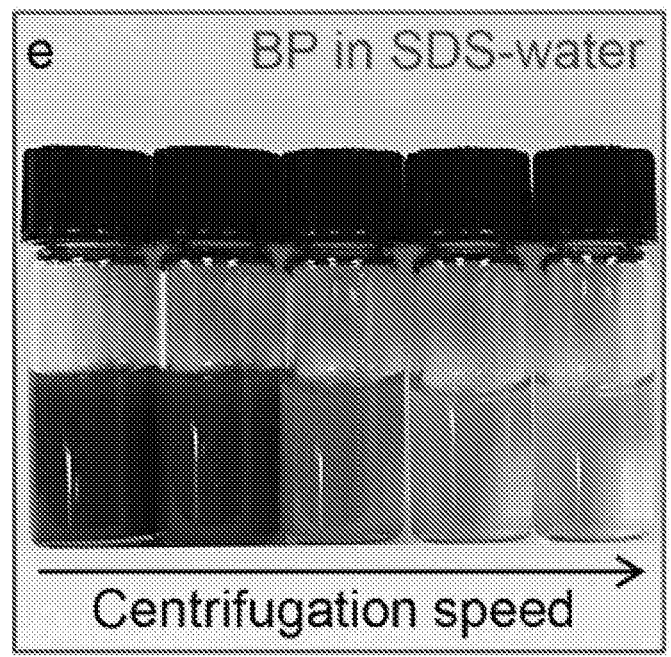
Figure 4F:
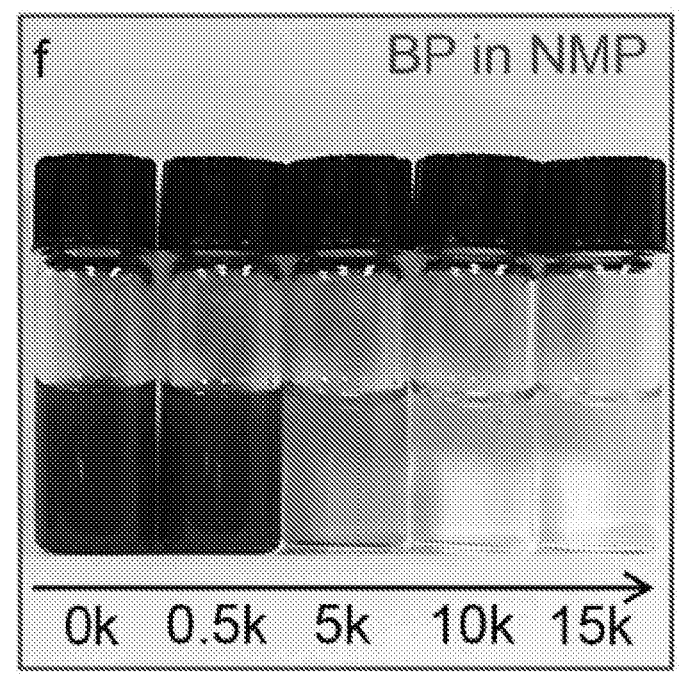
Figure 4G:
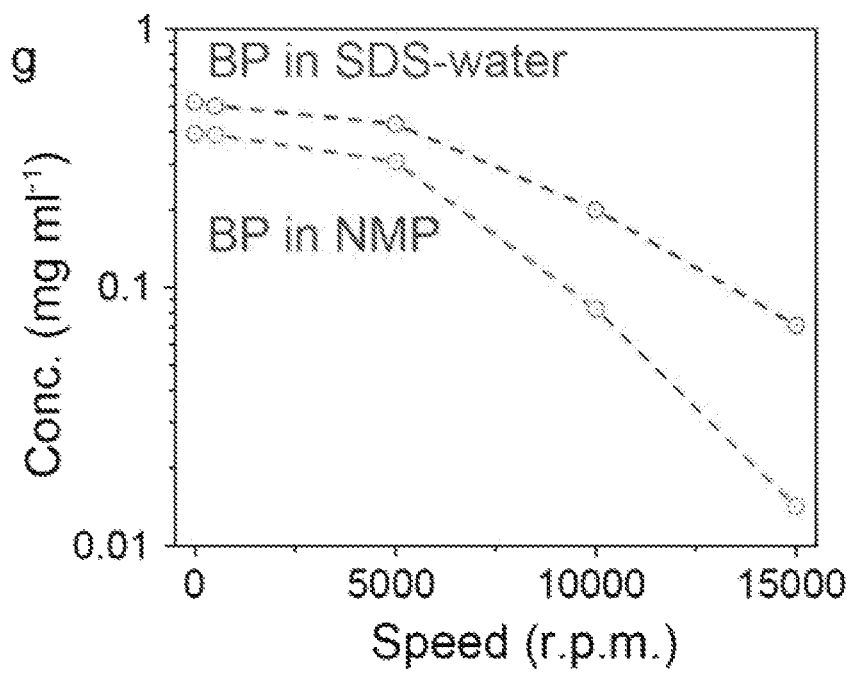
Figure 4H:
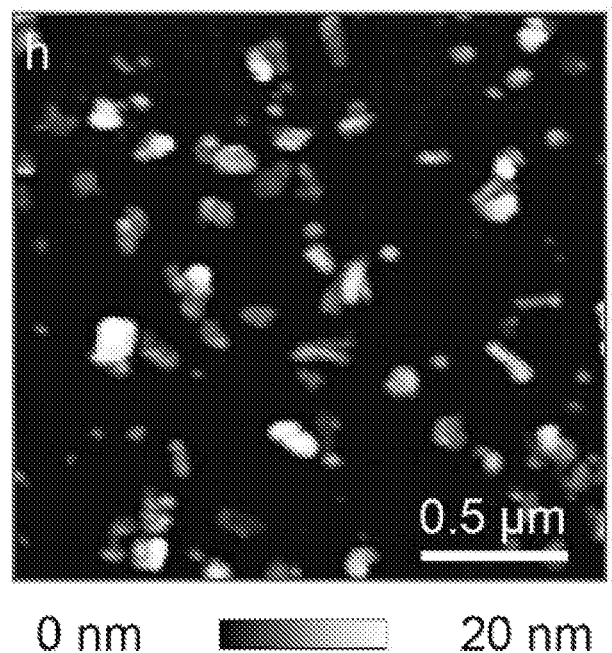
Figure 4I:
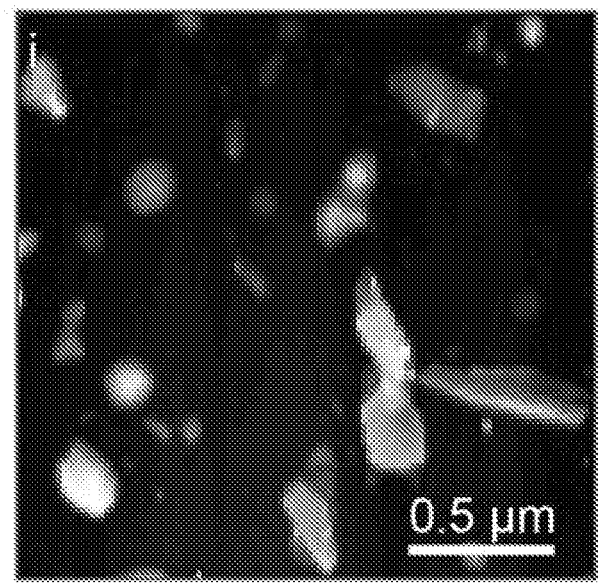
Figure 4J:
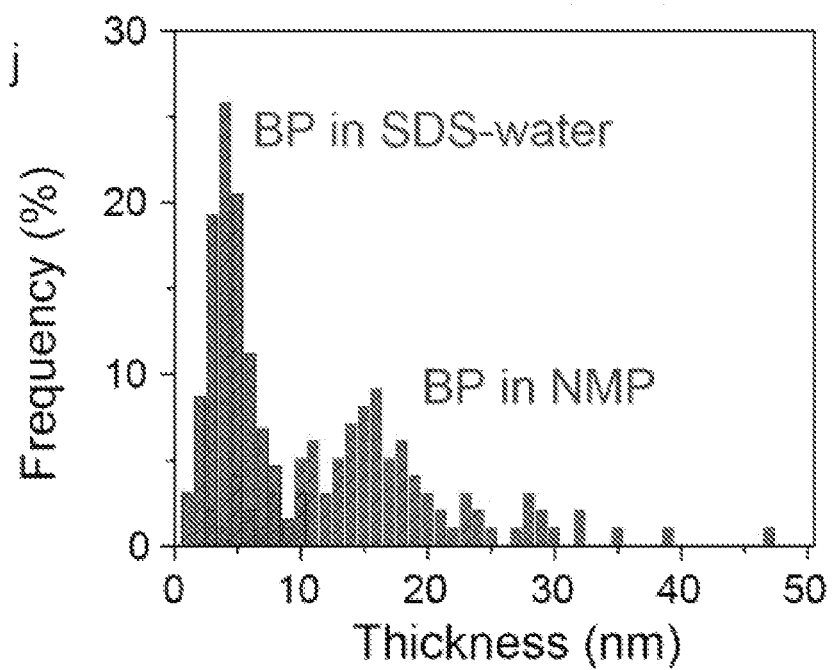
Figure 5:
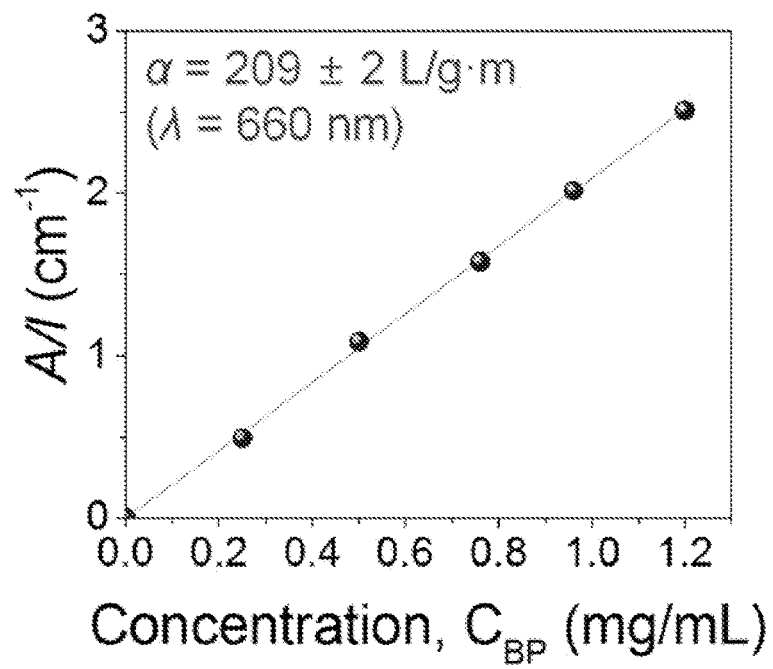
FIG. 5. Extinction measurements of FL-P dispersions in sodium dodecylsulfate (SDS)-water. The extinction coefficient is found to be 209±2 Lg$^{-1}$ m$^{-1}$, using the absorbance per length (A/l) at 660 nm versus the BP concentration. To calculate the concentration, FL-P dispersions with different volumes were filtered on an AAO membrane with 20 nm pore size, and then the mass difference was compared before and after filtration.
Figure 6A:
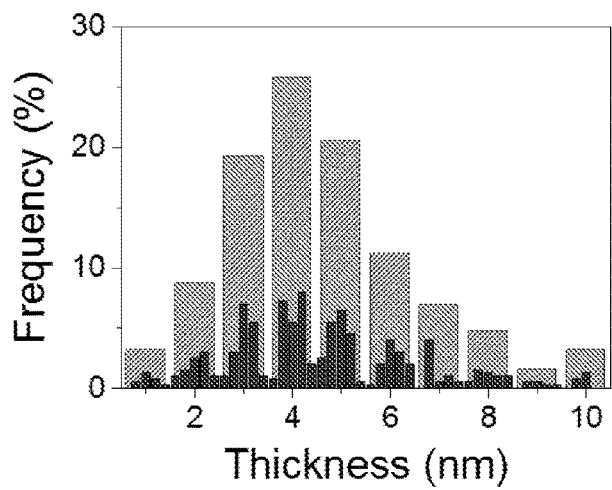
FIGS. 6A-B. AFM derived flake thickness distributions. Thickness histogram (A) and area histogram (B) of FL-P nanosheets prepared in SDS-water. The layer thickness was defined as ~1 nm from the thickness histogram with the smaller scale (brown).
Figure 6B:
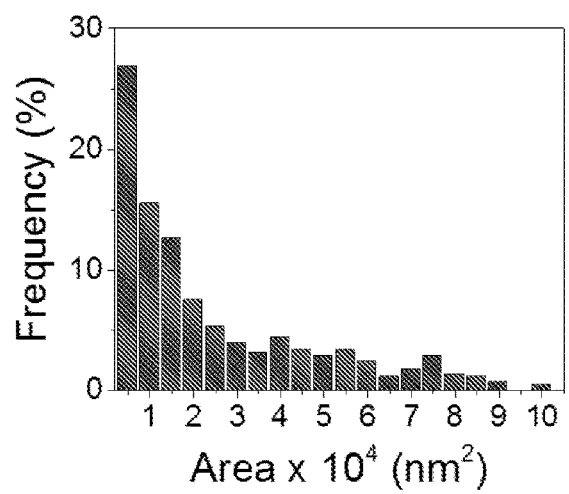

To investigate BP stability, LPE in both SDS-water and NMP was performed under identical exfoliation and centrifugation conditions. Centrifugation in each case occurred in steps ranging from 500 r.p.m. to 15,000 r.p.m. in order to compare the concentration of the resulting dispersions. FIGS. 4E and 4F show that the BP dispersion in NMP possesses a lighter yellow color, indicative of a lower concentration, compared to BP in SDS-water. The actual concentration of BP in SDS-water was calculated from the optical absorbance at 660 nm, using the measured extinction coefficient shown in FIG. 5 (the extinction coefficient that was used for BP in NMP was reported in the literature). This analysis concluded that the concentration of BP in SDS-water is approximately an order of magnitude higher than that of BP in NMP after centrifuging at 15,000 r.p.m. (FIG. 4G). Atomic force microscopy (AFM) images of BP exfoliated in SDS-water (red) and NMP (green) followed by 7,500 r.p.m. centrifugation are shown in FIGS. 4H-I. The thickness histogram in FIG. 4J reveals that FL-P nanosheets prepared in SDS-water have a tighter thickness distribution and thinner average thickness (4.5 nm compared to 17.6 nm) than BP prepared in NMP. Additional thickness and area histograms for FL-P prepared in SDS-water with smaller bins are provided in FIGS. 6A-B. These results illustrate the effectiveness of aqueous surfactant solutions for producing thin FL-P nanosheets compared to organic solvents.

Figure 7A:
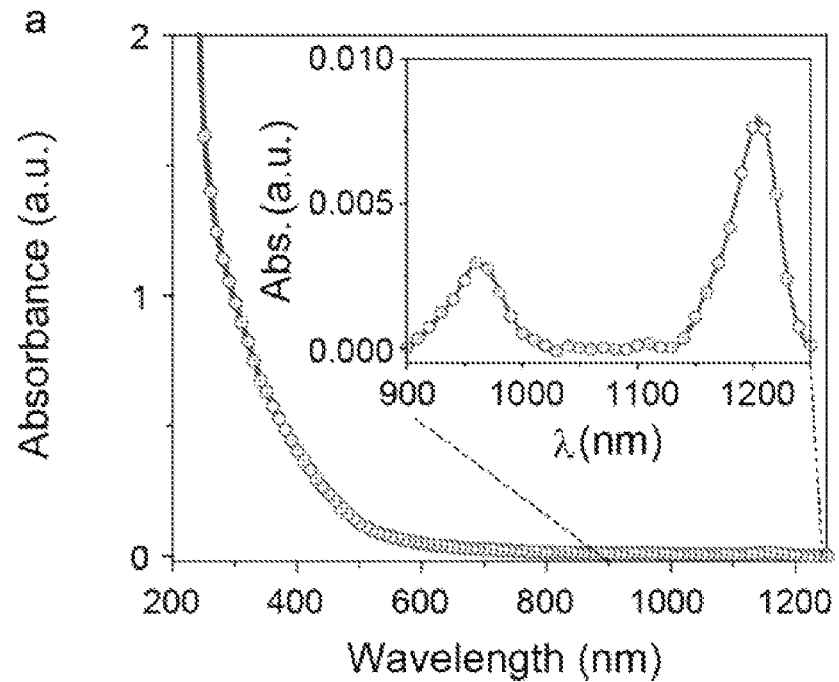
FIGS. 7A-C. Optical properties of FL-P aqueous dispersions. A, Optical absorbance spectrum of FL-P and a higher resolution plot in the range between 900 nm and 1250 nm (inset). B, PL spectra of FL-P aqueous dispersions. Three peaks corresponding to monolayer, bilayer, and three-plus layer phosphorene are observed at ~907 nm, ~1215 nm, and ~1428 nm, respectively. C, PL spectra of FL-P dispersions (red) and $O_2$-exposed FL-P dispersions (blue), and XPS spectra of $O_2$-exposed FL-P dispersions.
Figure 7B:
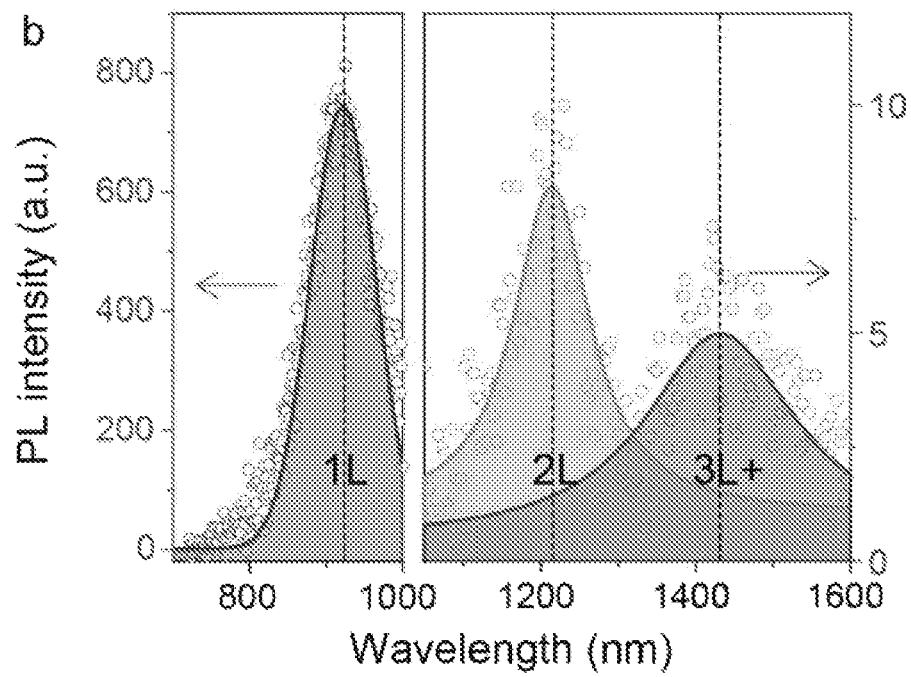

Following FL-P composition/solution preparation, optical absorbance spectra were measured (FIG. 7A). A higher resolution optical absorbance spectrum shows two peaks between 900 nm and 1250 nm (FIG. 7A, inset), which is consistent with previous reports for monolayer and bilayer phosphorene. PL spectroscopy was also performed on the FL-P solution using an excitation wavelength of 532 nm and a Si CCD for emission wavelengths up to 1000 nm and a $N_2$-cooled InGaAs array for emission wavelengths between 1000 nm and 1600 nm. In FIG. 7B, the measured PL spectra were fit with Gaussian functions at peak positions of ~907 nm (red area), 1215 nm (orange area), and ~1428 nm (green area). To correlate these peak positions with the number of phosphorene layers, micromechanically exfoliated BP flakes were prepared on a 300 nm $SiO_2$/Si substrate and then passivated with thin $Al_2O_3$ films. PL spectra and corresponding optical microscopy images for flakes ranging in thickness from one layer (1L) to five layers (5L) and more are shown in FIGS. 8-11. Based on the PL peak positions measured for the micromechanically exfoliated BP flakes, the peaks at ~907 nm, ~1215 nm, and ~1428 nm from the FL-P dispersion (FIG. 7B) are assigned to 1L, 2L, and 3L+ phosphorene, respectively.

Figure 12A:
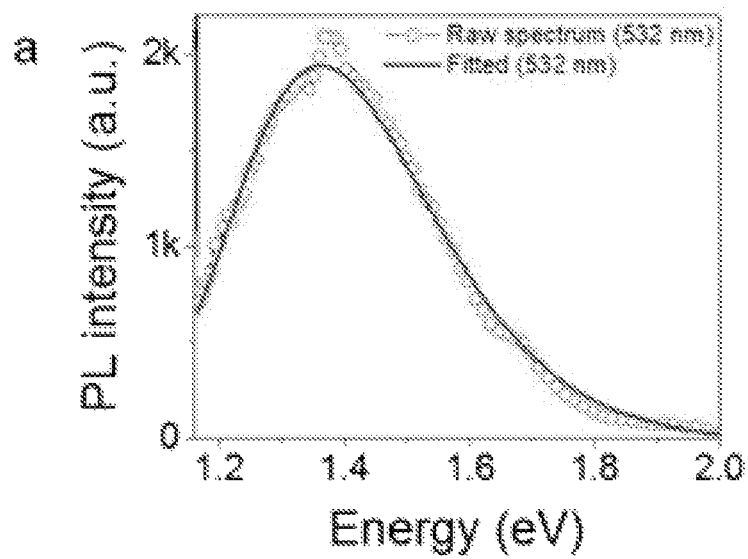
FIGS. 12A-E. Digital images and solid-state PL spectra of BP nanosheets cast from solution. A, PL spectrum of FL-P aggregates on a 300 nm $SiO_2$/Si substrate. B, Optical image of FL-P aggregates on the substrate. C, PL mapping image displaying a peak position of ~909 nm (~1.36 eV). Overlaying (b) with (c) shows that the PL emission comes from the aggregated FL-P. D, PL spectra with respect to UV ozone exposure time. With increasing exposure, the PL emission intensity at ~909 nm decreases from monolayer phosphorene oxidation. Furthermore, an emission peak develops at ~780 nm (~1.59 eV), likely related to $PD_x$ species. Finally, a SDS Raman band disappears with 60 min UV exposure. E, Emission intensities at ~780 nm (green) and ~909 nm (red) as a function of UV ozone exposure time. The peak at ~909 nm decreases monotonically as the FL-P is oxidized. The peak at ~780 nm increases initially but ultimately decays from extended chemical modification.
Figure 12B:
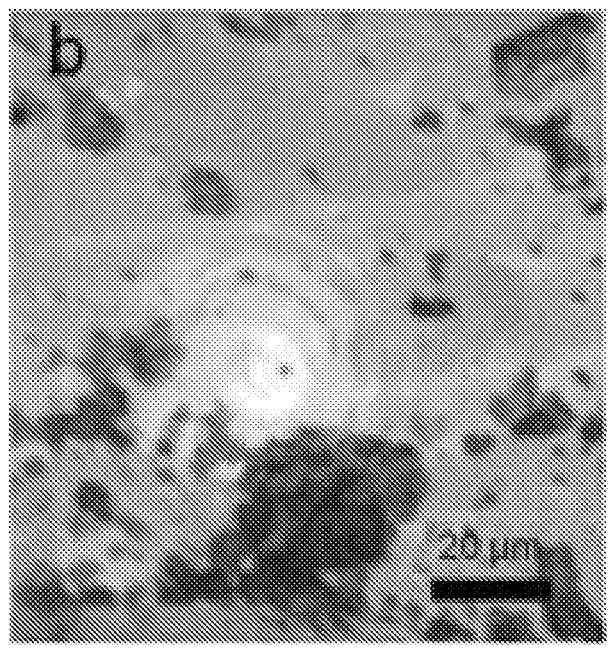
Figure 12C:
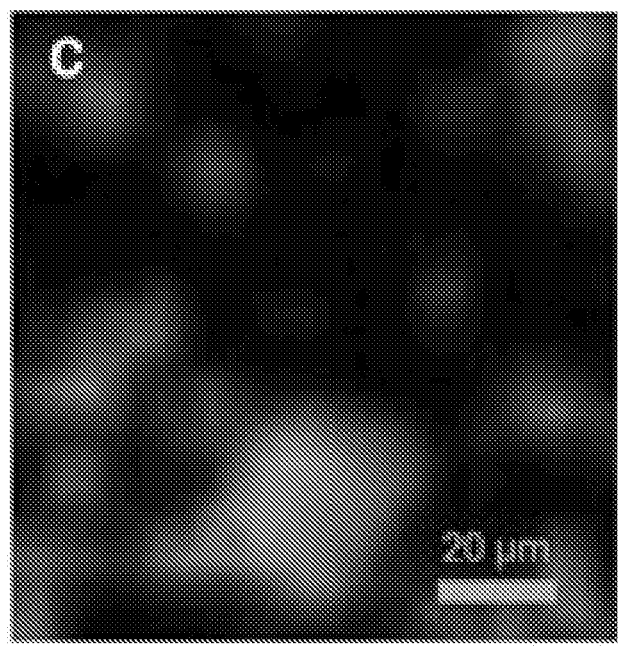
Figure 13A:
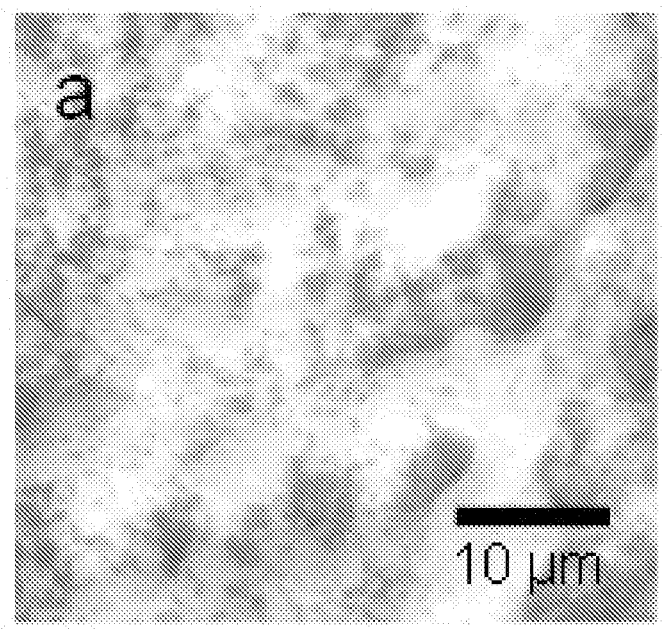
FIGS. 13A-C. Digital images and infrared, solid-state PL spectra of solution cast BP nanosheets. A, Optical image of unencapsulated FL-P aggregates on native oxide ($SiO_x$) on Si(100). B, Visible PL spectrum for the aggregates in (a), exposed to a ~350 µW, 532 nm laser (50×, 0.8 NA objective, 15 s acquisition in air). Monolayer phosphorene emission is present at 909 nm (~1.36 eV), with an additional emission at ~797 nm (~1.56 eV). Spectrum agrees well with the FL-P aggregate emissions of FIG. 12. C, Infrared PL spectra for the aggregates in (a). Control $SiO_x$/Si(100) spectrum (purple) shows a weak Si emission (red) at ~1121 nm (~1.11 eV). FL-P aggregates are broadband emitters, having bilayer (1261 nm, ~0.98 eV), three-layer (1459 nm, ~0.85 eV), four-layer (1528 nm, ~0.81 eV), and five-layer (1588 nm, ~0.78 eV) phosphorene emissions. A band tail from monolayer phosphorene (see (b)) also exists (peak at 1035 nm given for reference). Solution-cast phosphorene emission energies are consistent with the mechanically exfoliated BP spectra of FIGS. 8-11. All peak emission wavelengths determined by Voigt fits to the baseline-corrected spectra.
Figure 13B:
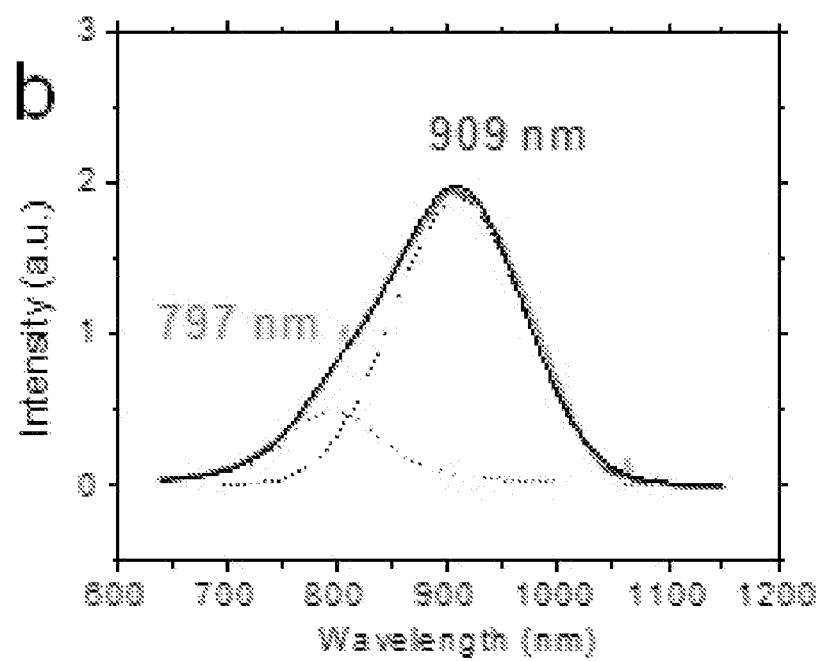
Figure 13C:
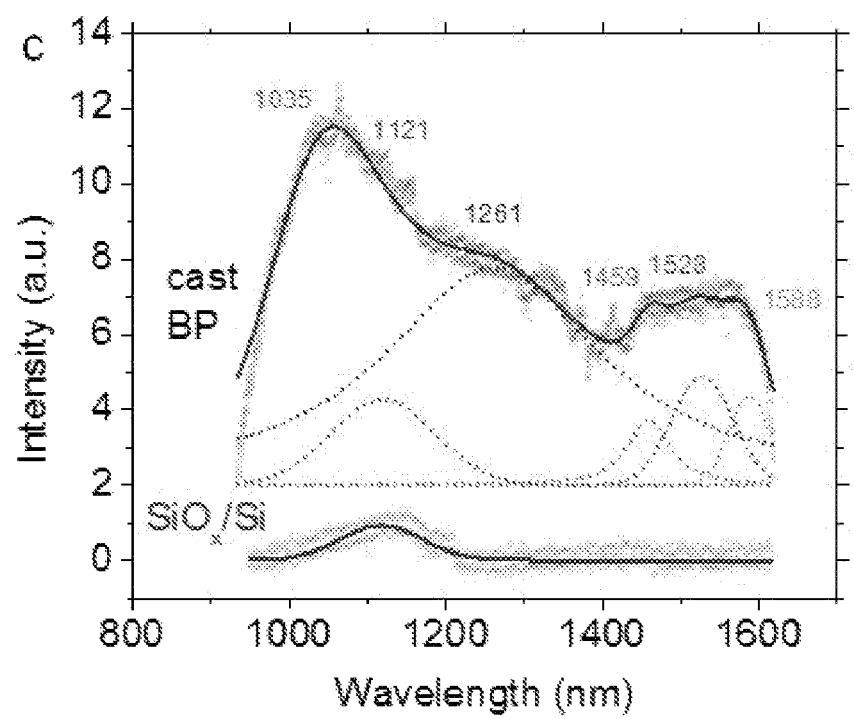

Additionally, solid-state PL spectra were measured on articles comprising FL-P aggregates deposited onto a $SiO_2$/Si substrate using an excitation wavelength of 532 nm. The measured PL spectra have a 1L peak position at ~909 nm, as shown in FIG. 12A. In FIG. 13, additional peaks were observed for 2L at ~1261 nm and 3L+ at ~1459 nm, ~1528 nm, And ~1588 nm using a thermoelectrically cooled InGaAs array. The positions of the PL peaks from FL-P are indicated in Table 1. The peak position differences between the liquid-phase sample and the solid-state sample can be attributed to the different dielectric screening from the surrounding environment.

TABLE 1

Optical emissions for monolayer and few-layer phosphorene sheets. All emissions probed by solid-state PL spectroscopy. Errors are propagated from the FWHM values of each phosphorene emission.

| Layer number | Isolation scheme | Primary emission (eV) |
|---|---|---|
| Monolayer | Mechanical exfoliation | 1.34 ± 0.15 eV |
| Bilayer | Mechanical exfoliation | 0.97 ± 0.16 eV |
| Three-layer | Mechanical exfoliation | 0.85 ± 0.09 eV |
| Four-layer | Mechanical exfoliation | 0.82 ± 0.10 eV |
| Five-layer | Mechanical exfoliation | 0.78 ± 0.06 eV |
| Monolayer | Solution cast | 1.38 ± 0.18 eV |
| Bilayer | Solution cast | 0.98 ± 0.79 eV |
| Three-layer | Solution cast | 0.85 ± 0.03 eV |
| Four-layer | Solution cast | 0.81 ± 0.05 eV |
| Five-layer | Solution cast | 0.78 ± 0.03 eV |

Figure 7C:
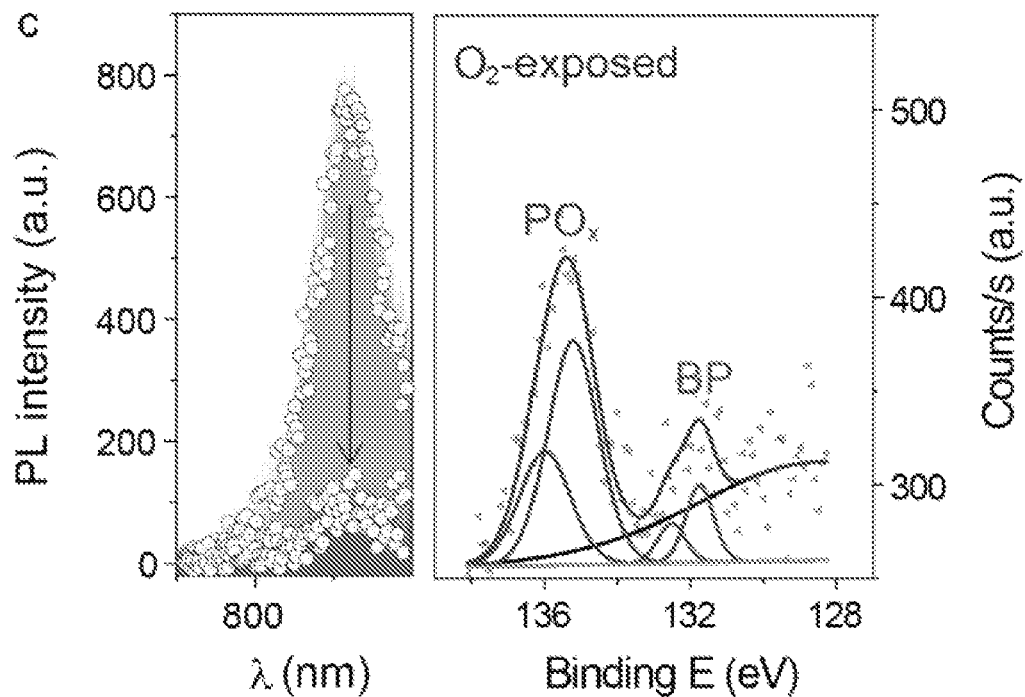
Figure 8A:
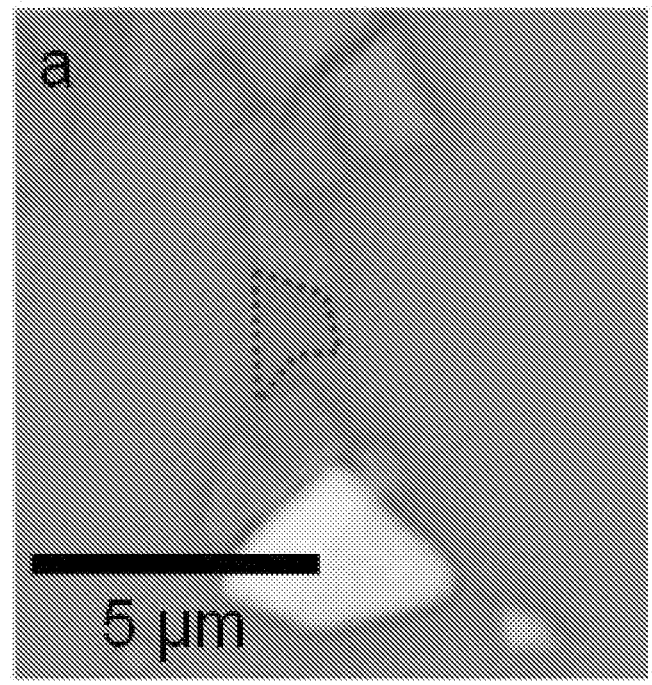
Figure 8B:
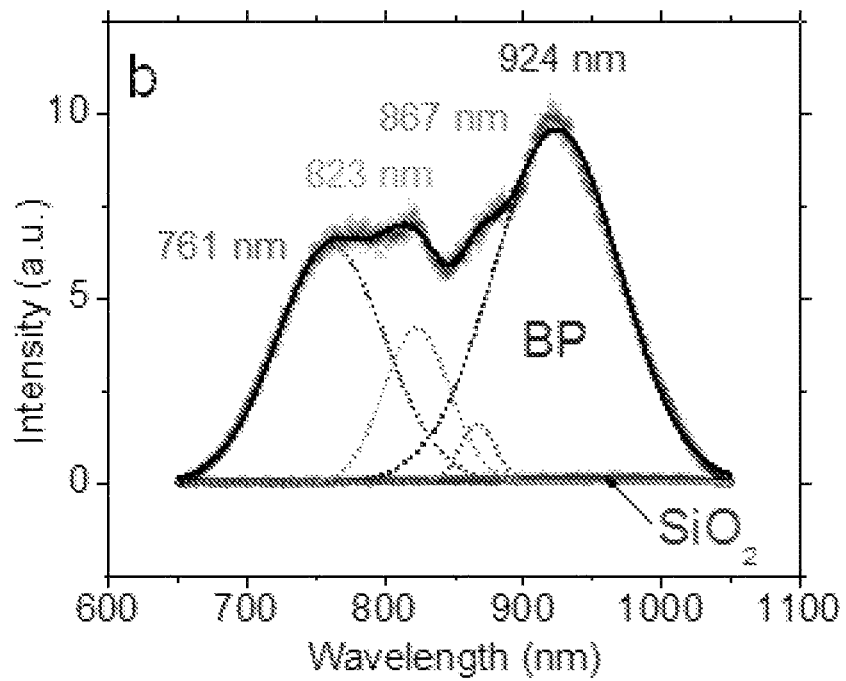
Figure 8C:
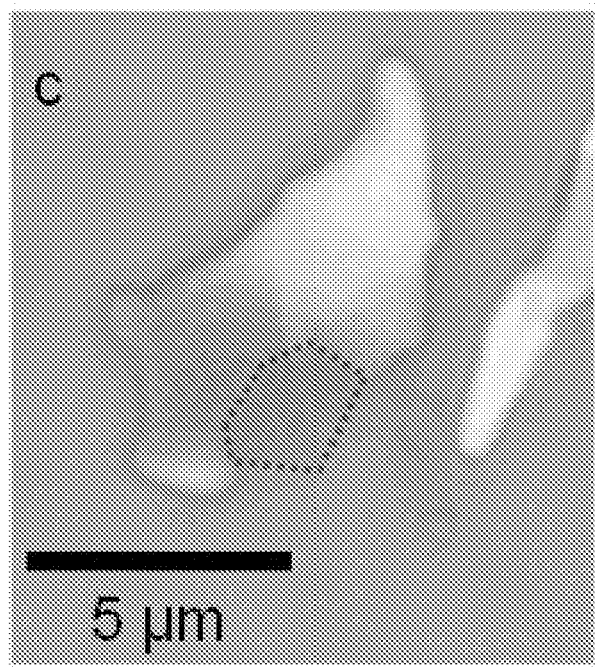
Figure 10A:
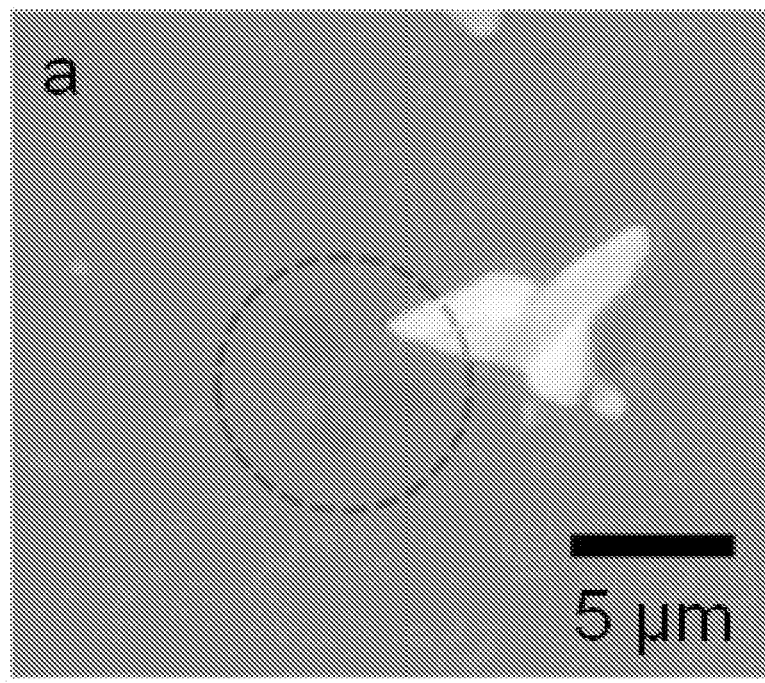
FIGS. 10A-D. Digital images and polarized PL spectra of three-layer and four-layer phosphorene. A, Optical image of a three-layer phosphorene flake, passivated by ~10.0 nm $AlO_x$ (~2.5 nm at 50° C. ALD, ~7.5 nm at 150° C. ALD). B, Polarization dependent PL spectra for the three-layer phosphorene in (a), ranging from minimum ("perpendicular") to maximum ("parallel") phosphorene emission (blue-dotted) at ~1468 nm (~0.84 eV). Polarization invariant Si emission (red-dotted) at 1137 nm (~1.09 eV). The sample was excited with a 532 nm laser at ~200 µW (50×, 0.8 NA objective, 5 s acquisition in air). C, Optical image of a four-layer phosphorene flake, encapsulated like (a). D, Polarization dependent PL spectra for the four-layer phosphorene in (c), with maximum phosphorene emission (blue-dotted, "parallel") at 1522 nm (~0.81 eV) and Si emission (red-dotted) at 1134 nm (~1.09 eV). The sample was excited at ~250 nW with all other exposure conditions being the same as (b).
Figure 10B:
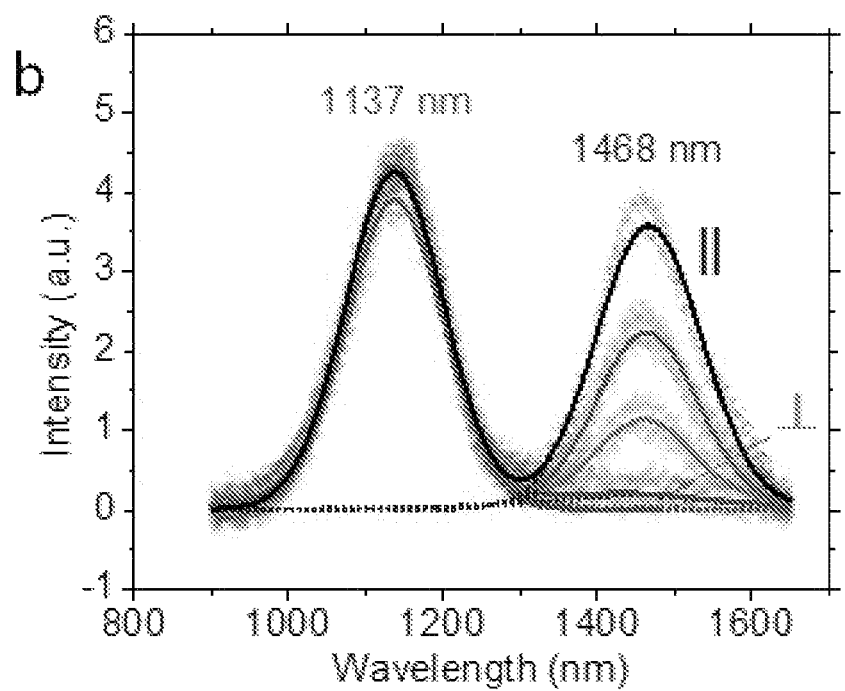
Figure 10C:
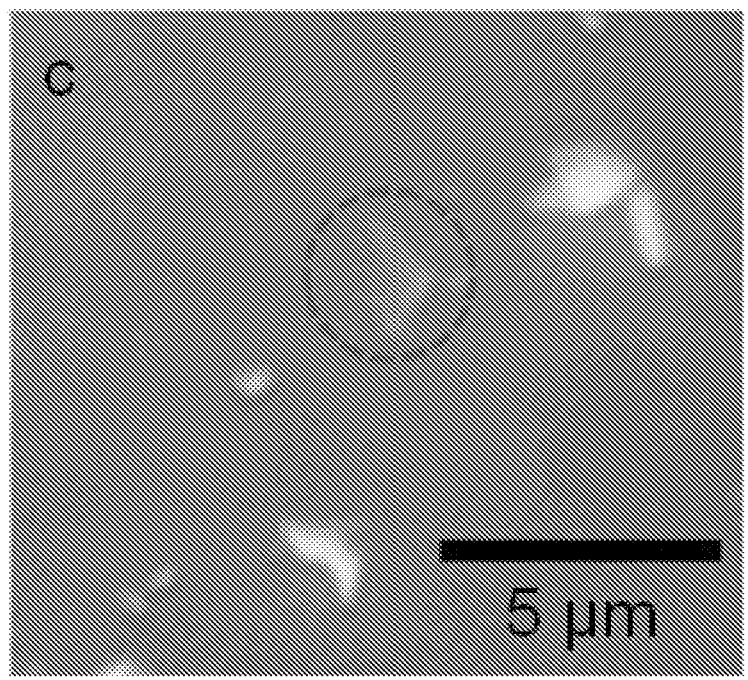
Figure 10D:
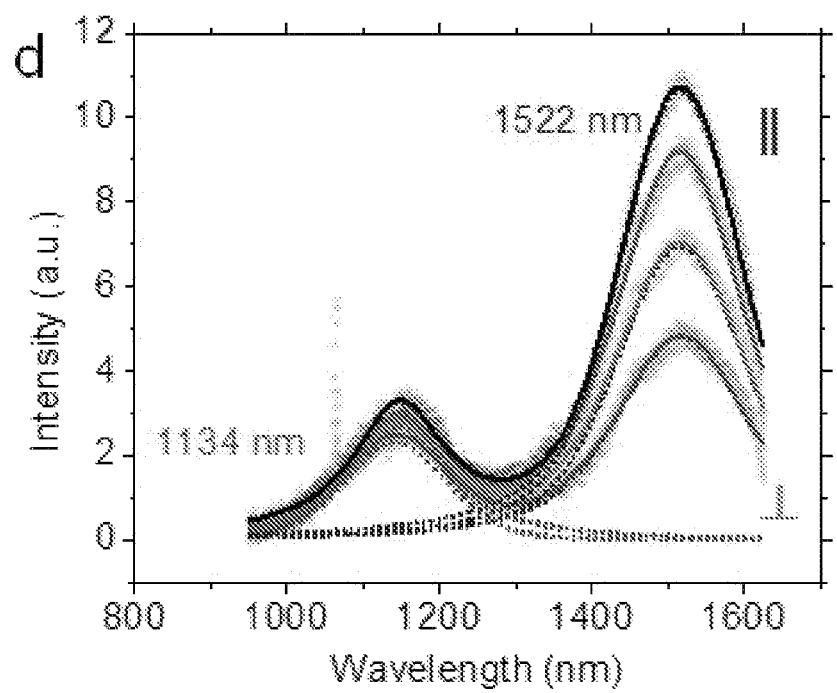
Figure 11D:
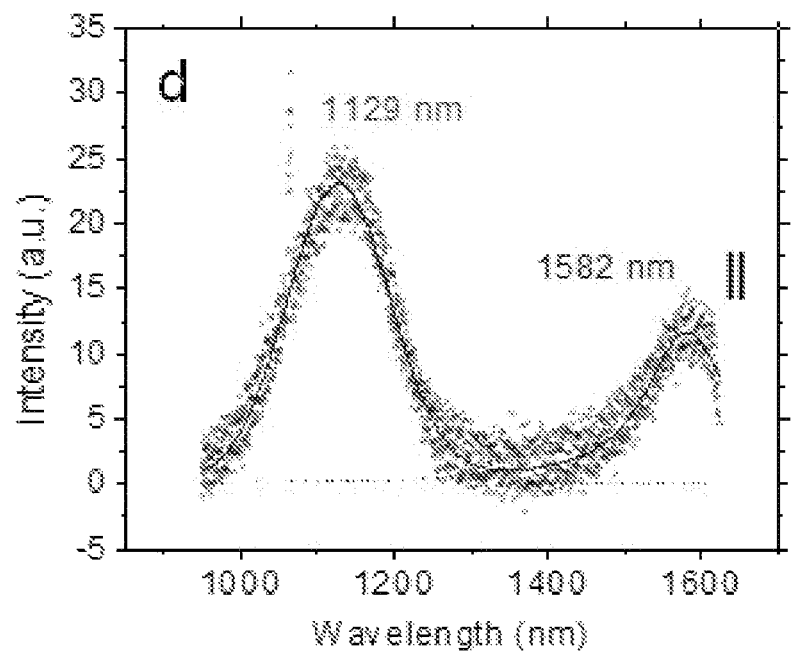
Figure 12D:
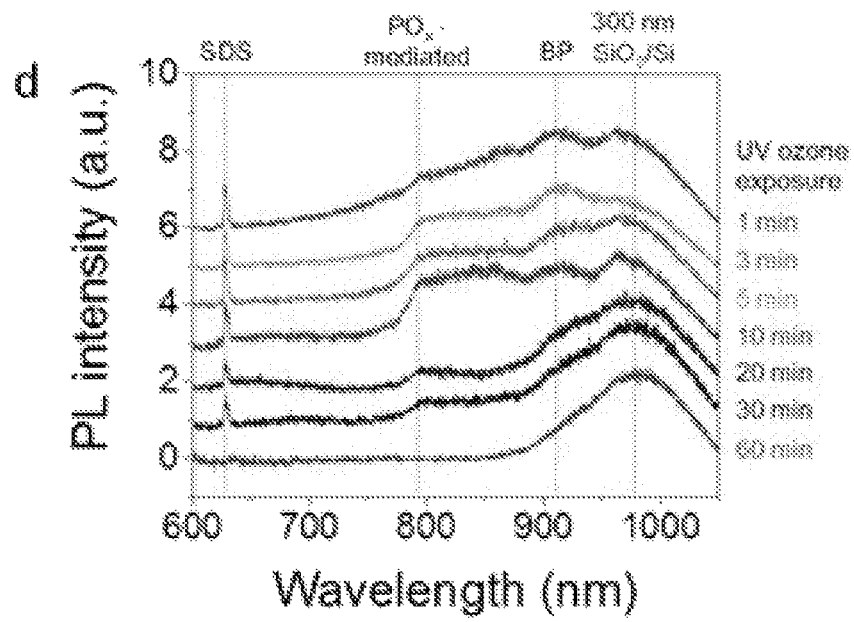
Figure 12E:
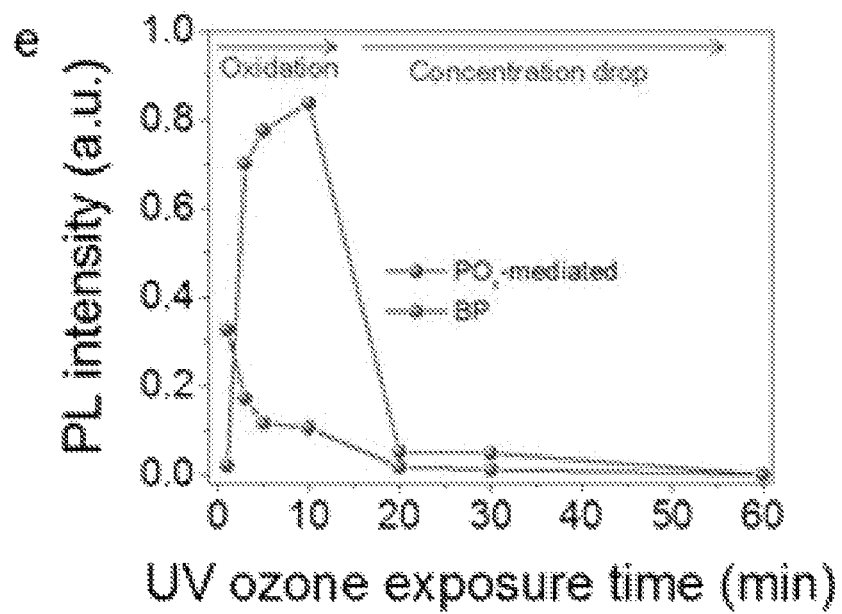

To verify that the observed PL is not defect-mediated, FL-P aggregates were exposed to UV ozone to intentionally introduce oxygen defects. As the UV ozone exposure time increases, the PL emission intensity at ~909 nm decreases and a $PD_x$ defect-mediated emission peak emerges at ~780 nm (FIG. 12D). The emission intensities at ~909 nm (red curve) and ~780 nm (green curve) are plotted as a function of UV ozone exposure time, with the 909 nm peak monotonically decreasing as the FL-P is oxidized, and the 780 nm peak initially increasing in intensity due to increased defect concentration and ultimately decaying due to the complete destruction of the material (FIG. 12E). This observation corresponds closely to the time-evolution of PL with respect to photo-oxidation time for micromechanically exfoliated BP (FIG. 8D). Furthermore, PL spectra were measured under the same excitation conditions on the FL-P dispersion before (red area) and after oxidation introduced by $O_2$ gas bubbling (blue area). Following oxidation, the FL-P shows significantly decreases in PL intensity (FIG. 7C, left) in addition to substantial increases in the $PD_x$ XPS peak (FIG. 7C, right). Consequently, the PL peaks observed in FIG. 7B can be attributed to 1L, 2L, and 3L+ phosphorene, as opposed to defects introduced by solution processing.

Figure 14A:
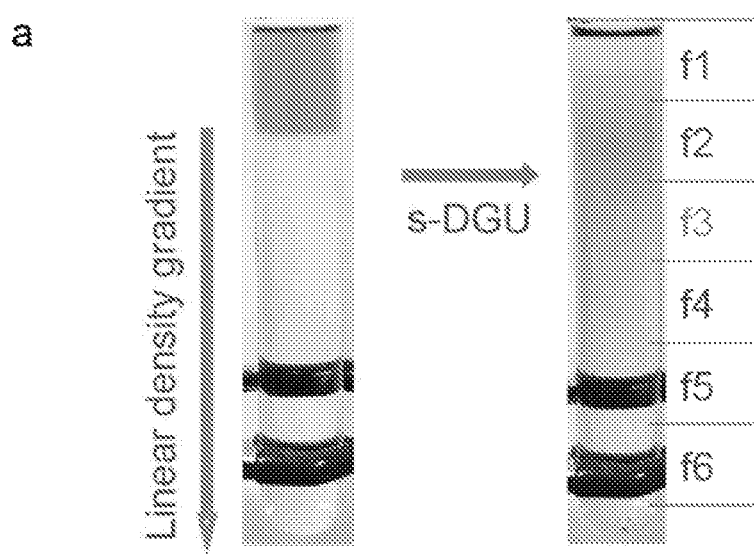
Figure 14B:
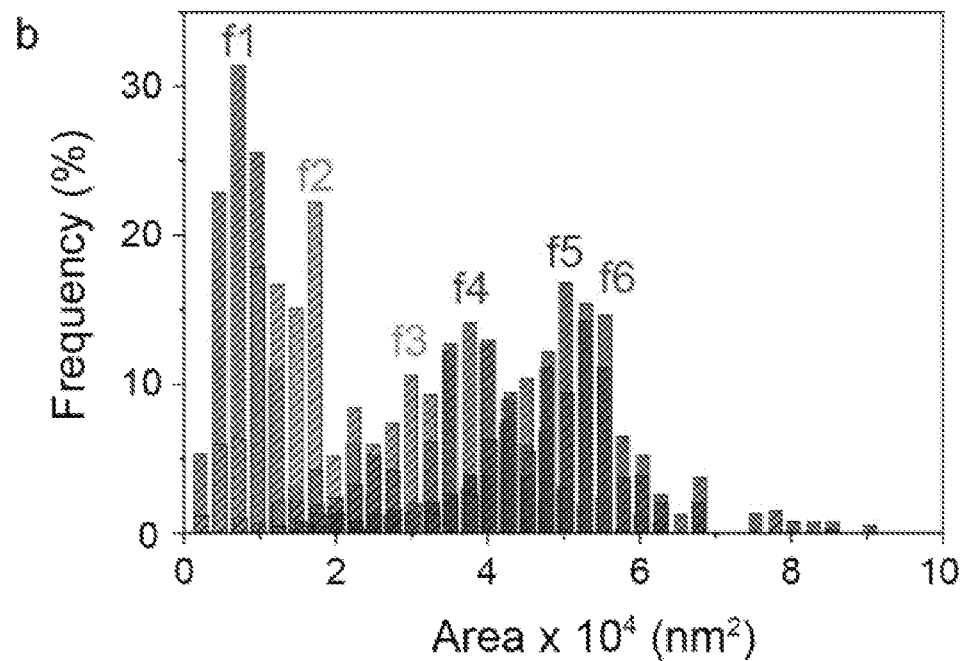

To explore the electrical properties of individual FL-P nanosheets, field-effect transistors (FETs) were fabricated by electron-beam lithography (EBL). Prior to FET device fabrication, lateral size sorting of the FL-P solution was performed to enrich large FL-P nanosheets that can bridge the 200 nm electrode gap. Lateral size sorting of the FL-P solution was achieved by sedimentation-based density gradient ultracentrifugation (s-DGU). By using s-DGU, the average flake area was tuned by over an order of magnitude (FIG. 14A). Each fraction (f1 to f6 from the top to the bottom of the centrifuge tube) was collected and deposited onto Si substrates for AFM measurements. The AFM images of f1, f3, and f5 clearly show the size differences between each fraction (FIG. 15). From the AFM measurements, the average areas of f3 to f6 were found to be appropriate for FET fabrication (FIG. 14B).

Figure 14C:
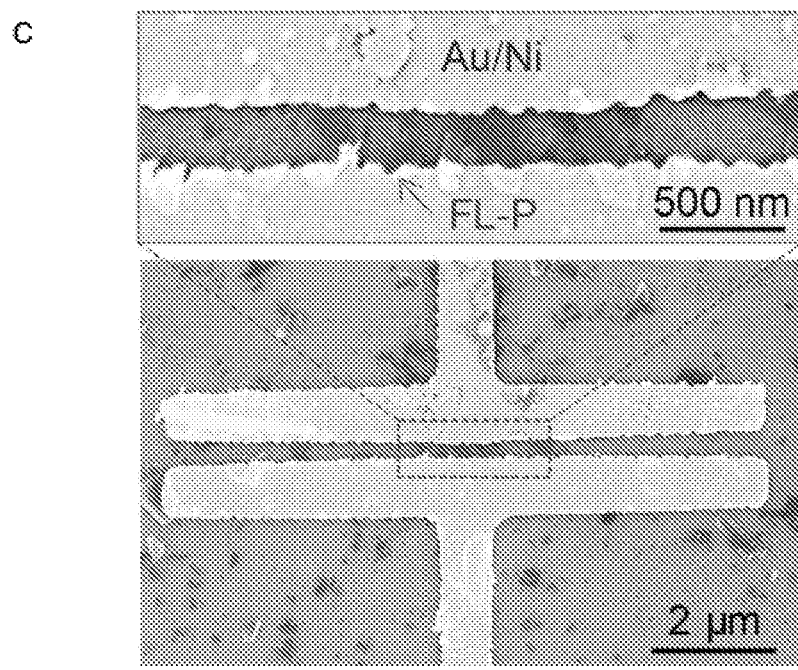
Figure 14D:
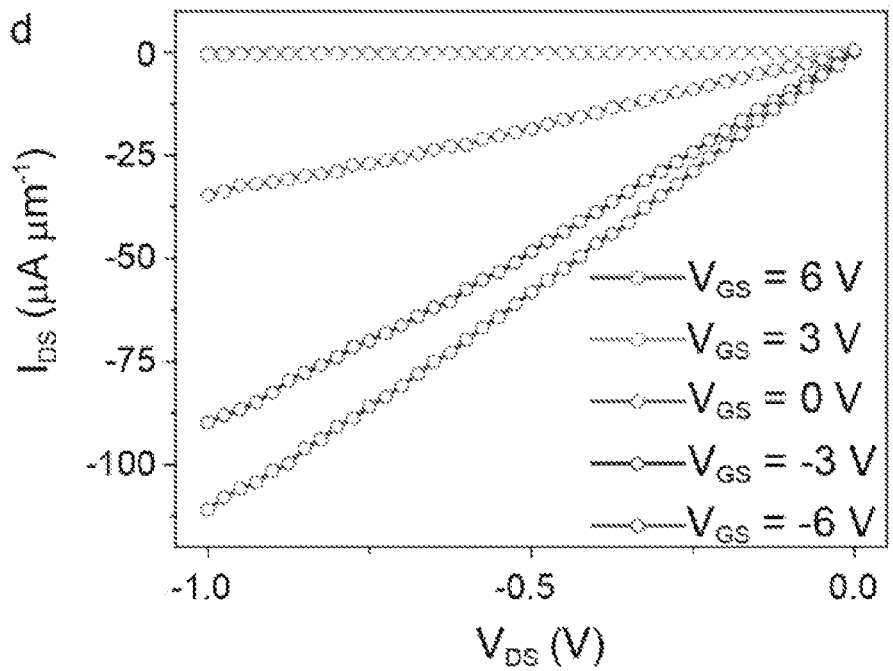
Figure 16:
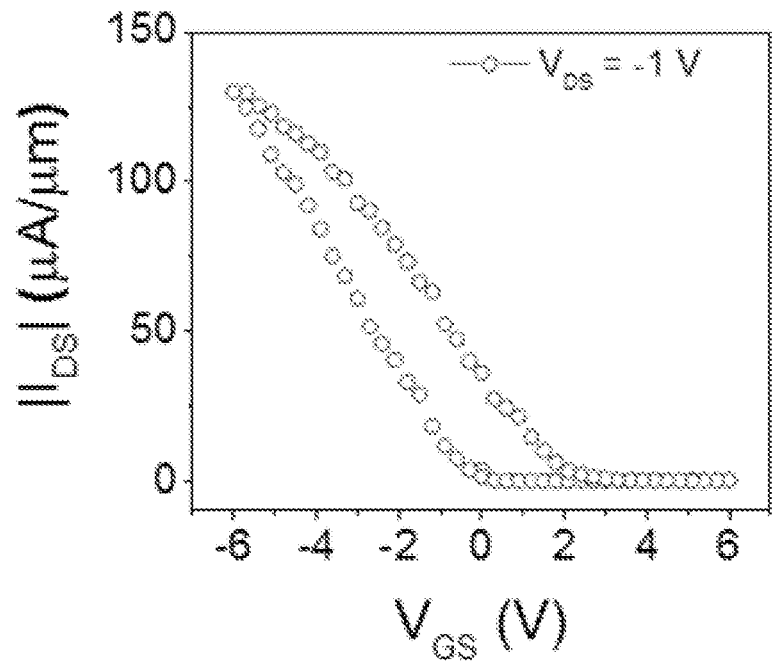
FIG. 16. FET measurements of FL-P nanosheets. The transfer curve of the FET article/device shown in FIG. 14E with the forward and reverse sweep.
Figure 17A:
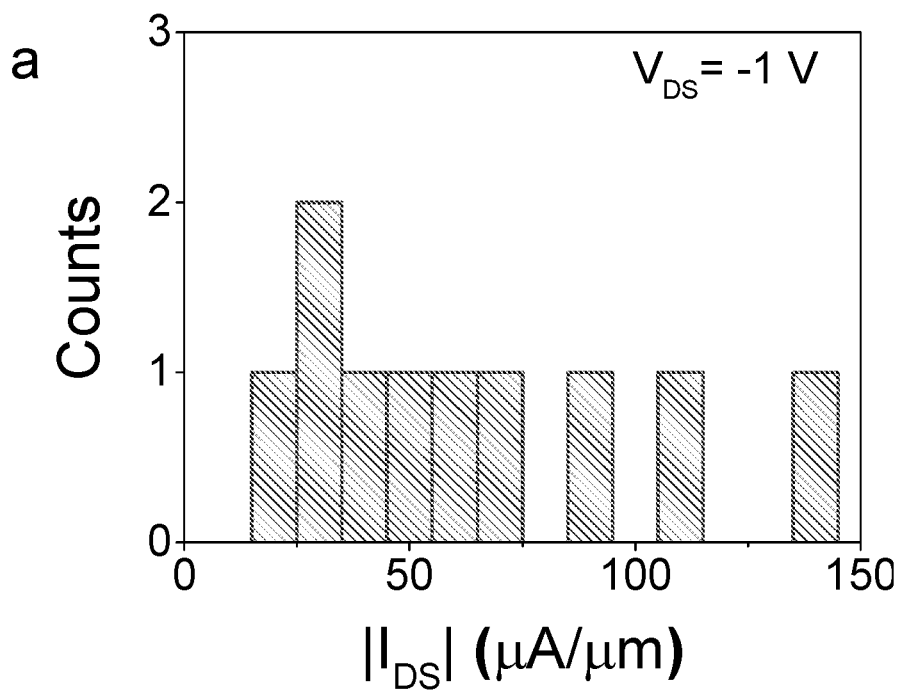
FIGS. 17A-B. Histograms of electrical properties of FL-P FETs. Histogram of A, drive current, and B, $I_{ON}/I_{OFF}$ ratio with logarithmic scale.
Figure 17B:
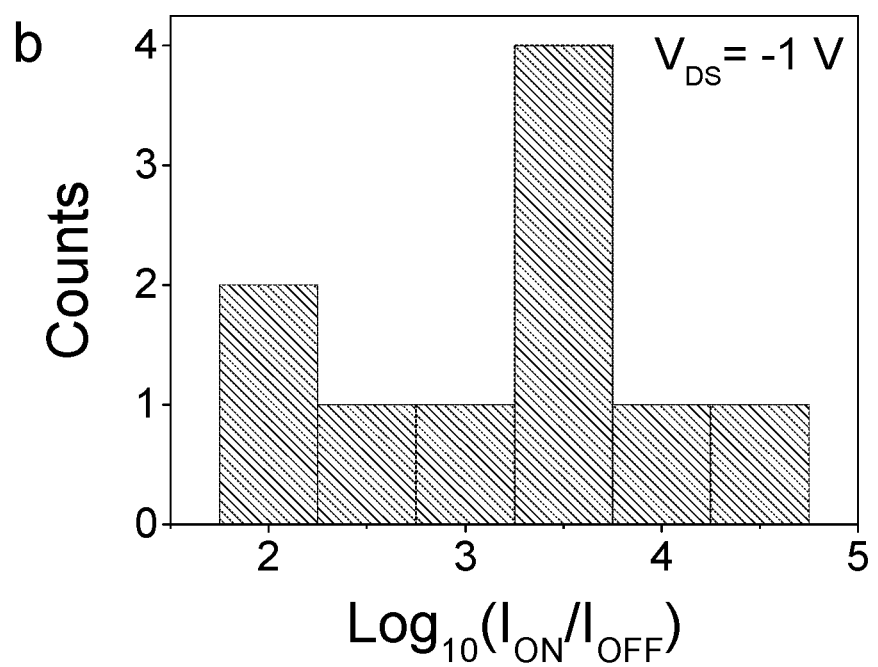

To prepare arrays of the FL-P nanosheets, fractions f3 to f6 were collected on anodic aluminum oxide (AAO) membranes by vacuum filtration, rinsed with deoxygenated water to remove excess surfactant, and transferred onto degenerately doped Si substrates coated with 20 nm of atomic layer deposition (ALD) $Al_2O_3$ or $HfO_2$. Following the FL-P transfer, Au/Ni electrodes of 10 μm width and 200 nm length were patterned using EBL. A false-colored scanning electron microscopy (SEM) image (FIG. 14C) shows several FL-P nanosheets (green) connected in parallel between two electrodes (yellow). FET output and transfer curves (FIGS. 14D-E) reveal ambipolar behavior for FL-P with a current modulation ($I_{ON}/I_{OFF}$ ratio) of ~5×10³ and maximum drive current ($I_{DS}$) of ~130 μA um$^{-1}$ at $V_{DS}$=1 V (the transfer curve for the forward and reverse gate voltage sweep is shown in FIG. 16). Histograms of the maximum drive current and current modulation from several FL-P FETs are shown in FIG. 17. For comparison, $I_{ON}/I_{OFF}$ ratio and maximum $I_{DS}$ values for BP FETs from the recent literature (both micromechanically exfoliated and organic solvent exfoliated) are plotted in FIG. 14F (Ref 3: Xia, F., Wang, H. & Jia, Y. Rediscovering black phosphorus as an anisotropic layered material for optoelectronics and electronics. *Nature Comm.* 5, 4458 (2014); Ref 6: Kang, J. et al. Solvent exfoliation of electronic-grade, two-dimensional black phosphorus. *ACS Nano* 9, 3596-3604 (2015); Ref. 10: Wood, J. D. et al. Effective passivation of exfoliated black phosphorus transistors against ambient degradation. *Nano Lett.* 14, 6964-6970 (2014); Ref 30: Du, Y., Liu, H., Deng, Y & Ye, P. D. Device perspective for black phosphorus field-effect transistors: contact resistance, ambipolar behavior, and scaling. *ACS Nano* 8, 10035~10042 (2014); Ref 31: Miao, J., Zhang, S., Cai, L., Scherr, M. & Wang, C. Ultrashort channel length black phosphorus field-effect transistors. *ACS Nano* 9, 9236-9243 (2015); and Ref 32: Wang, H. et al. Black phosphorus radio-frequency transistors. *Nano Lett.* 14, 6424-6429 (2014).)

Figure 14E:
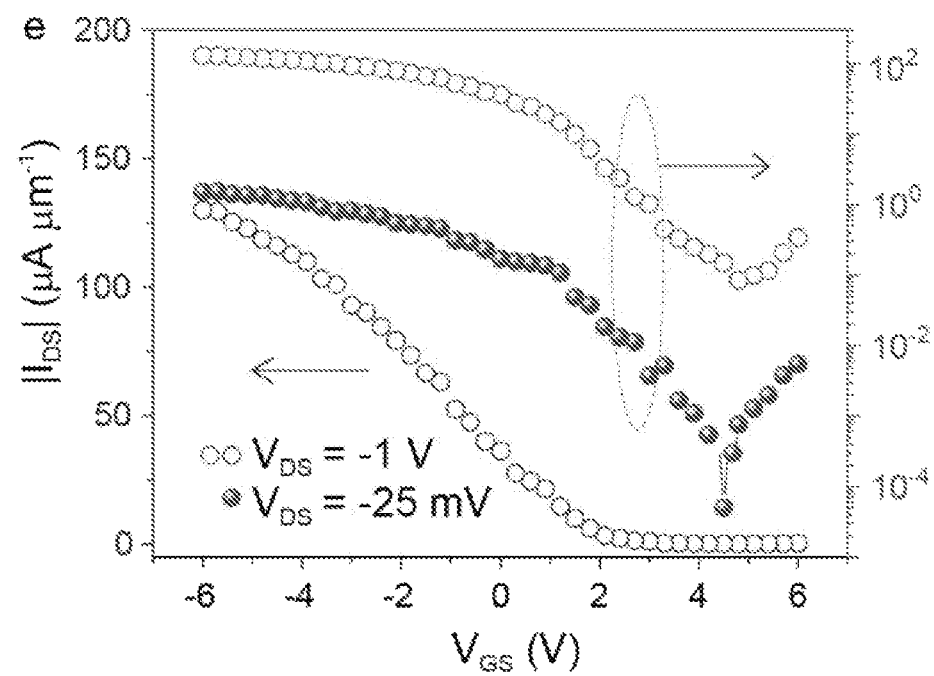

Results from the FL-P device from FIG. 14E are also shown as a yellow star on this plot. Since the upper right hand corner of this plot represents an optimal combined performance from the perspective of maximum drive current and current modulation, it is evident that aqueous-exfoliated FL-P compares favorably with competing BP exfoliation methods from the perspectives of electronic properties and utility for electronic devices.

More generally, relating to various embodiments of this invention, a variety of surface active components are effective at dispersing both the three-dimensional starting materials and the exfoliated two-dimensional planar nanomaterials. Without limitation, one or more surface active components can include one or more bile salts and/or alkali salts of linear alkyl sulfonates. Bile salts can be more broadly described as a group of molecularly rigid and planar amphiphiles with one or more charged groups opposing a hydrophobic face. Examples of bile salts include salts (e.g., sodium or potassium salts) of conjugated or unconjugated cholates and cholate derivatives including deoxycholates, chenodeoxycholates, taurodeoxycholates, glycochenodeoxycholates, ursodeoxycholates, and glycoursodeoxycholates.

Useful alkyl sulfates include butane not limited to sodium hexyl sulfate, sodium octyl sulfate, sodium decyl sulfate, sodium undecyl sulfate, sodium dodecyl sulfate, and lithium dodecyl sulfate. Other useful surface active components include non-ionic triblock copolymers of oxyethylene and oxypropylene (or poly(ethylene oxide) and poly(propylene oxide), respectively), known under the Pluronic trade name), which can be represented by the general formula $HO(C_2H_4O)_a(C_3H_6O)b(C_2H_4O)_aH$, wherein a and b are integers in the range of about 10 to about 300; and non ionic tetrafunctional block copolymers of oxyethylene and oxypropylene known under the Tetronic trade name. Various other amphiphilic surface active components useful in conjunction with this invention would be well-known to those skilled in the art, limited only by functional precluding capacity to exfoliate phosphorus starting material and disperse resulting few-layer phosphorene.

Generally, density gradient ultracentrifugation uses a fluid medium with a predefined variation in its density as a function of position within a centrifuge tube or compartment (i.e., a density gradient). Fluid media useful with the present teachings are limited only by nanomaterial aggregation therein to an extent precluding at least partial separation. Accordingly, aqueous and non-aqueous fluids can be used in conjunction with any substance soluble or dispersible therein, over a range of concentrations, so as to provide the medium a density gradient for use in the separation techniques described herein. Such substances can be ionic or non-ionic, non-limiting examples of which include inorganic salts and alcohols, respectively. Such a medium can include a range of aqueous iodixanol concentrations and the corresponding gradient of concentration densities. As understood by those skilled in the art, aqueous iodixanol is a common, widely used non-ionic density gradient medium. However, other media can be used in methods of the present teachings, as would be understood by those skilled in the art.

More generally, any material or compound stable, soluble or dispersible in a fluid or solvent of choice can be used as a density gradient medium. A range of densities can be formed by dissolving such a material or compound in the fluid at different concentrations, and a density gradient can be formed, for instance, in a centrifuge tube or compartment. More practically, with regard to choice of medium, the two-dimensional nanomaterials in composition with the surface active components should be soluble, stable or dispersible within the fluids/solvent or resulting density gradient. Likewise, from a practical perspective, the maximum density of the gradient medium, as determined by the solubility limit of such a material or compound in the solvent or fluid of choice, should be at least as large as the buoyant density of the nanomaterial-surface active component complexes for a particular medium. Accordingly, any aqueous density gradient medium can be used provided that the nanomaterials are stable; that is, do not aggregate to an extent precluding useful separation. Alternatives to iodixanol include inorganic salts (such as CsCl, $Cs_2SO_4$, KBr, etc.), polyhydric alcohols (such as sucrose, glycerol, sorbitol, etc.), polysaccharides (such as polysucrose, dextrans, etc.), other iodinated compounds in addition to iodixanol (such as diatrizoate, nycodenz, etc.), and colloidal materials (such as Percoll®).

EXAMPLES

The following non-limiting examples and data illustrate various aspects and features relating to the methods, materials, compositions, articles and/or devices of the present invention, including the preparation and/or separation of few-layer phosphorene as are available through the methodologies described herein. In comparison with the prior art, the present methods, compositions and articles/devices provide results and data which are surprising, unexpected and contrary thereto. While the utility of this invention is illustrated through the use of several phosphorene materials, compositions, separation fractions, media and surface active agents which can be used therewith, it will be understood by those skilled in the art that comparable results are obtainable with various other phosphorene materials, compositions, fractions thereof, media and/or surface active agents, as are commensurate with the scope of this invention.

Example 1

FL-P dispersion preparation: BP crystals were purchased from Smart-Elements and stored in a dark Ar glovebox prior to use. Deionized water with 2% w surfactant was purged with ultrahigh purity grade Ar for at least 1 hr to remove dissolved oxygen. A customized tip ultrasonicator setup was prepared by perforating the plastic lid of a 50 mL conical tube with a 0.125 inch sonicator tip. The interface between the tip and the lid was sealed with PDMS several times to block potential diffusion pathways of ambient $O_2$ and $H_2O$. The deoxygenated water and BP were placed in this sealed conical tube with an initial concentration of 1 mg mL$^{-1}$ under Ar atmosphere with less than 10% relative humidity. Additionally, Parafilm and Teflon tapes were used to further seal the vessel from ambient exposure. The sealed container was connected to the ultrasonicator (Fisher Scientific model 500 sonic dismembrator) in ambient conditions, and then BP crystals were exfoliated by ultrasonication. The resulting solution was centrifuged at 7,500 r.p.m. for 2 hrs at 15° C. to enrich FL-P nanosheets (Avanti J-26 XP, Beckman Coulter). Following centrifugation, the supernatant was collected and then ultracentrifuged at 14,000 r.p.m. for 2 hrs at 22° C. using a SW32Ti rotor (Optima L-80 XP, Beckman Coulter) before redispersing in deoxygenated water.

Example 2

Size selection of FL-P: 3 mL of as-prepared FL-P dispersion was carefully placed on top of a 10 mL linear density gradient (1.05 to 1.10 g cm$^{-3}$) formed using deoxygenated iodixanol that was loaded with 2% w v$^{-1}$ SDS. Ultracentrifugation was then performed at 10,000 r.p.m. for 1 hr at 22° C. using a SW41 Ti rotor (Beckman-Coulter). Following ultracentrifugation, fractionation was achieved using a piston gradient fractionator (BioComp Instruments).

Example 3

Contact angle measurements: Water droplet contact angles on BP crystals were measured by a contact angle goniometer. Flat BP crystals were purchased from HQ Graphene. Fresh BP surfaces were prepared by micromechanical exfoliation with water droplets placed on the surface within ~30 sec. A high-resolution camera attached on the goniometer captured images from which the contact angle was determined.

Example 4

Zeta potential measurement: Zeta potential measurements were carried out using a Zetasizer Nano ZS (Malvern Instruments) with clear disposable zeta cells. A He—Ne laser source with a wavelength of 633 nm and a maximum power of 5 mW was used for the measurements. The reported results are averages from three independent measurements at 25° C.

Example 5

Atomic force microscopy (AFM): AFM images were acquired in tapping mode using an Asylum Cypher AFM with Si cantilevers (~290 kHz resonant frequency). As-prepared solutions were deposited onto Si substrates, rinsed with deoxygenated water to remove surfactant, and dried on a hot plate at 80° C. for 10 min in a flowing Ar environment. Prior to deposition, Si substrates were rinsed with acetone, methanol, and deionized water and immersed in diluted (3-aminopropyl)-triethoxysilane (APTES) solution to promote adhesion. After BP deposition on the Si substrate, an environmental cell was assembled in a flowing Ar environment and attached to a Cypher ES scanner under a laminar flow of ultrahigh purity grade N2. Images were taken in the repulsive phase regime at a scanning rate of ~0.4 Hz using a minimum of 1024 samples per line. During scanning, N2 was continuously flowed through the environmental cell under optical microscopy light illumination.

Example 6

Transmission electron microscopy (TEM): A BP solution droplet was deposited on a holey carbon TEM grid (Ted-Pella) and dried with N2. The TEM grid was assembled with a TEM sample holder after fewer than 5 min of exposure to ambient air. The TEM images were taken with a JEOL JEM-2100 at an accelerating voltage of 200 keV with a TEM column pressure of ~$10^{-7}$ Torr.

Example 7

Raman spectroscopy: Raman spectra of the solutions were obtained using a Horiba LabRAM HR Evolution with an excitation wavelength of 532 nm. A clear quartz cuvette with 10 mm transmitted path length was used for the measurement. Data were collected for 120 sec at ~50 mW using an angled cuvette holder for the solution samples.

Example 8

X-ray photoelectron spectroscopy (XPS): XPS measurements were performed using a high vacuum Thermo Scientific ESCALAB 250 Xi XPS system at a base pressure of ~$1 \times 10^{-9}$ Ton. The XPS data had a binding energy resolution of ~0.1 eV using a monochromated Al Kα X-ray source at 1486.7 eV (~400 μm spot size). All core-level spectra were the average of five scans taken at a 100 ms dwell time using a pass energy of 15 eV. When using charge compensation, all core levels were charge-corrected to adventitious carbon at ~284.8 eV. Using the software suite Avantage (Thermo Scientific), all subpeaks were determined in a manner detailed in the literature. (Kang, J. et al. Solvent exfoliation of electronic-grade, two-dimensional black phosphorus. ACS Nano 9, 3596-3604 (2015).) The p core level spectra for phosphorus and silicon were fit with doublets.

Example 9

Photoluminescence (PL) spectroscopy: PL spectra for the solution samples were obtained using a Horiba Fluorolog-3 spectrofluorometer. Data were measured in a quartz cuvette for 3 sec. A liquid $N_2$ cooled InGaAs array was used for the spectra at wavelengths longer than 1000 nm. PL spectra for the solid-state samples on 300 nm $SiO_2$/Si substrates were collected using a Horiba Xplora Raman/PL system with an excitation wavelength of 532 nm. Data were collected for 120 sec using a 100× objective for point spectra and a 20× objective for mapping. This setup was used for the data in FIGS. 7 and 8. For the infrared PL measurements in FIGS. 9-11, and 13, a spectrometer (Princeton Aston) with a NIRvana InGaAs thermoelectrically cooled array at an excitation wavelength of 532 nm was employed. Data were collected for 5 sec using a 100× near-infrared objective. All PL spectral fits were performed with spline baselines and Voigt (Gaussian-Lorentzian) functions. Spectral fits disregarded any lineshape changes due to differences in grating efficiency at off-blaze wavelengths.

Example 10

Optical absorbance spectroscopy: Optical absorbance spectra were obtained using a Cary 5000 spectrophotometer (Agilent Technologies). A quartz cuvette with 10 mm path length was used for the measurements. The baseline from the aqueous surfactant solution was subtracted from the spectra.

Example 11

FL-P nanosheets transfer by PDMS stamping: The few-layer phosphorene nanosheets were collected on anodic aluminum oxide (AAO) membranes with 100 nm pore size by vacuum filtration. Following vacuum filtration, the nanosheets on the membrane were rinsed with ~300 mL of deoxygenated water to remove the surfactants. The nanosheets on the membrane were then transferred onto the target substrates using PDMS stamping.

Example 12

Field-effect transistor fabrication and measurement: Field-effect transistors (FETs) were fabricated using electron beam lithography to define 200 nm long, 10 um wide electrodes (5 nm Ni and 30 nm Au). BP FETs were measured in a Lakeshore CRX 4K under a base pressure of less than ~$5 \times 10^{-4}$ Torr at room temperature. Two Keithley sourcemeter 2400 units were used to measure device performance. Equation 1 was used to measure carrier mobility:

$$\mu_{eff} = \frac{L g_d}{W C_{ox} V_{DS}} \quad (1)$$

where $\mu_{eff}$ is the field-effect mobility, L is the channel length (obtained from optical micrographs), $g_d$ is the transconductance, W is the channel width (obtained from optical micrographs), Cox is the oxide capacitance (measured values of $1.02 \times 10^{-2}$ and $2.00 \times 10^{-3}$ F·cm$^{-2}$ were used for 20 nm thick ALD $HfO_2$ and $Al_2O_3$, respectively), and $V_{DS}$ is the applied source-drain bias.

As demonstrated, effective exfoliation of FL-P nanosheets has been achieved by ultrasonication in deoxygenated water stabilized with surfactants. This method results in stable, highly concentrated few-layer phosphorene, with distinct advantages compared to exfoliation in organic solvents. Comprehensive microscopic and spectroscopic analysis shows that individual FL-P nanosheets possess properties comparable to micromechanically exfoliated BP flakes without chemical degradation following aqueous processing. For example, PL measurements demonstrate that FL-P aqueous dispersions show strong visible and near-infrared emission that is characteristic of 1L, 2L, and 3L+ phosphorene. FL-P aqueous dispersions are also amenable to further size sorting by s-DGU, which allows for the enrichment of flakes with large lateral areas suitable for FET fabrication. The resulting FETs confirm that aqueous-exfoliated FL-P can be incorporated into electronic devices with performance metrics competitive with the best BP transistors to date.

What is claimed is:

1. A composition, comprising:
   a few-layer phosphorene nanomaterial comprising at least one of mono-, bi-, and n-layer phosphorene nanosheets, wherein n is an integer selected from 3 to 6;
   deoxygenated water; and
   at least one amphiphilic surface active component, wherein said at least one amphiphilic surface active component is selected from alkali metal alkylsulfates and combinations thereof.

2. The composition of claim 1, wherein said at least one amphiphilic surface active component is sodium dodecylsulfate.

3. The composition of claim 1, wherein said few-layer phosphorene nanomaterial is separable into two or more separation fractions comprising a subpopulation of few-layer phosphorene nanosheets comprising a surface area, each said fraction comprising monolayer phosphorene nanosheets, bilayer phosphorene nanosheets and trilayer phosphorene nanosheets, or combinations thereof.

4. The composition of claim 3, wherein said two or more separation fractions are obtainable by centrifuging said few-layer phosphorene nanomaterial in a deoxygenated fluid medium comprising a density gradient.

5. The composition of claim 4, wherein said deoxygenated fluid medium comprises deoxygenated aqueous iodixanol.

6. The composition of claim 5, wherein said deoxygenated fluid medium comprises a plurality of deoxygenated aqueous iodixanol concentrations, said density gradient comprising a range of concentration densities.

7. The composition of claim 6, wherein one of said two or more separation fractions is within said density gradient at a substantially invariant point during centrifugation, said invariant point comprising a density approximating a buoyant density of the one of said two or more separation fractions.

8. A composition, comprising:
   a few-layer phosphorene nanomaterial comprising at least one of mono-, bi-, and n-layer phosphorene nanosheets, wherein n is an integer selected from 3 to 6;
   deoxygenated water; and
   at least one amphiphilic surface active component, wherein said at least one amphiphilic surface active component is selected from bile salts and combinations thereof, wherein said bile salts comprise potassium salts of conjugated or unconjugated cholates and derivatives thereof.

9. The composition of claim 8, wherein said conjugated or unconjugated cholates and cholate derivatives comprise deoxycholates, chenodeoxycholates, taurodeoxycholates, glycochenodeoxycholates, ursodeoxycholates, and/or glycoursodeoxycholates.

10. A composition, comprising:
    a few-layer phosphorene nanomaterial comprising at least one of mono-, bi-, and n-layer phosphorene nanosheets, wherein n is an integer selected from 3 to 6;
    deoxygenated water; and
    at least one amphiphilic surface active component, wherein said at least one amphiphilic surface active component is selected from non-ionic triblock oxyalkylene copolymers and combinations thereof.

11. The composition of claim 10, wherein said at least one amphiphilic surface active component is a copolymer of oxyethylene and oxypropylene.

12. The composition of claim 10, wherein said few-layer phosphorene nanomaterial is separable into two or more separation fractions comprising a subpopulation of few-layer phosphorene nanosheets comprising a surface area, each said fraction comprising monolayer phosphorene nanosheets, bilayer phosphorene nanosheets and trilayer phosphorene nanosheets, or combinations thereof.

13. The composition of claim 12, wherein said two or more separation fractions are obtainable by centrifuging said few-layer phosphorene nanomaterial in a deoxygenated fluid medium comprising a density gradient.

14. The composition of claim 13, wherein said deoxygenated fluid medium comprises deoxygenated aqueous iodixanol.

15. The composition of claim 14, wherein said deoxygenated fluid medium comprises a plurality of deoxygenated aqueous iodixanol concentrations, said density gradient comprising a range of concentration densities.

16. The composition of claim 15, wherein one of said two or more separation fractions is within said density gradient at a substantially invariant point during centrifugation, said invariant point comprising a density approximating a buoyant density of the one of said two or more separation fractions.

* * * * *